(12) United States Patent
Abe et al.

(10) Patent No.: US 8,847,250 B2
(45) Date of Patent: Sep. 30, 2014

(54) ORGANIC LIGHT-EMITTING ELEMENT AND MANUFACTURING METHOD OF THE SAME, ORGANIC DISPLAY PANEL, AND ORGANIC DISPLAY DEVICE

(75) Inventors: Yuuki Abe, Hyogo (JP); Hideaki Matsushima, Osaka (JP)

(73) Assignee: Panasonic Corporation, Osaka (JP)

( * ) Notice: Subject to any disclaimer, the term of this patent is extended or adjusted under 35 U.S.C. 154(b) by 311 days.

(21) Appl. No.: 13/465,565

(22) Filed: May 7, 2012

(65) Prior Publication Data

US 2012/0217518 A1 Aug. 30, 2012

Related U.S. Application Data

(63) Continuation of application No. PCT/JP2010/005247, filed on Aug. 25, 2010.

(51) Int. Cl.
| | |
|---|---|
| *H01L 33/38* | (2010.01) |
| *H01L 27/32* | (2006.01) |
| *H01L 51/52* | (2006.01) |
| *H01L 51/50* | (2006.01) |

(52) U.S. Cl.
CPC ........ *H01L 27/3246* (2013.01); *H01L 51/5206* (2013.01); *H01L 51/5012* (2013.01); *H01L 2251/558* (2013.01); *H01L 51/5088* (2013.01)
USPC .............................................. 257/91; 438/34

(58) Field of Classification Search
CPC .............. H01L 27/124; H01L 27/1248; H01L 27/3338; H01L 27/3258; H01L 27/3248; H01L 51/5209; H01L 27/326

USPC .................................................. 438/34; 257/91
See application file for complete search history.

(56) References Cited

U.S. PATENT DOCUMENTS

| | | | |
|---|---|---|---|
| 5,443,922 A | 8/1995 | Nishizaki et al. | |
| 7,405,515 B2 * | 7/2008 | Satake | 313/512 |

(Continued)

FOREIGN PATENT DOCUMENTS

| | | |
|---|---|---|
| JP | 05-163488 | 6/1993 |
| JP | 2004-127551 | 4/2004 |

(Continued)

OTHER PUBLICATIONS

Office Action from U.S. Patent and Trademark Office (USPTO) in U.S. Appl. No. 13/716,551, dated Apr. 4, 2014.

(Continued)

*Primary Examiner* — George Fourson, III
(74) *Attorney, Agent, or Firm* — Greenblum & Bernstein, P.L.C.

(57) ABSTRACT

The upper surface portion of a planarization layer is planarized. In an anode formed on the planarization layer, upper surface portions at edge regions by a bank are located above an upper surface portion at a central region. A hole injection transporting layer is layered along the upper surface portions of the anode, and in the hole injection transporting layer, upper surface portions at the edge regions near the bank are located above an upper surface portion at the central region. In an organic light-emitting layer, upper surface portions at the edge regions (regions $D_1$ and $D_2$) near the bank are located above an upper surface portion at the central region (region $D_3$). As a result, thicknesses $T_{11}$ and $T_{12}$ of the light-emitting layer are equivalent to a thickness $T_{13}$ of the organic light-emitting layer.

9 Claims, 15 Drawing Sheets

(56) References Cited

U.S. PATENT DOCUMENTS

| | | | |
|---|---|---|---|
| 7,456,431 B2* | 11/2008 | Um et al. | 257/72 |
| 7,605,535 B2 | 10/2009 | Kobayashi | |
| 7,803,669 B2* | 9/2010 | Cho et al. | 438/148 |
| 7,812,345 B2 | 10/2010 | Yoshida et al. | |
| 7,842,947 B2* | 11/2010 | Nakatani et al. | 257/40 |
| 7,888,867 B2 | 2/2011 | Yoshida et al. | |
| 7,903,055 B2 | 3/2011 | Nishikawa et al. | |
| 7,935,969 B2* | 5/2011 | Yamashita et al. | 257/72 |
| 7,955,908 B2* | 6/2011 | Ryu et al. | 438/149 |
| 8,203,158 B2* | 6/2012 | Yoshida et al. | 257/89 |
| 8,368,617 B2 | 2/2013 | Asaki et al. | |
| 8,436,348 B2* | 5/2013 | Ono et al. | 257/40 |
| 8,462,084 B2 | 6/2013 | Asaki et al. | |
| 8,481,351 B2* | 7/2013 | Kawasaki | 438/30 |
| 2004/0189194 A1 | 9/2004 | Kihara et al. | |
| 2004/0222740 A1 | 11/2004 | Kim | |
| 2006/0038488 A1* | 2/2006 | Fukunaga et al. | 313/506 |
| 2006/0086978 A1* | 4/2006 | Kobayashi | 257/347 |
| 2008/0023695 A1* | 1/2008 | Cho et al. | 257/40 |
| 2008/0024402 A1* | 1/2008 | Nishikawa et al. | 345/82 |
| 2008/0143649 A1 | 6/2008 | Asaki et al. | |
| 2008/0238295 A1 | 10/2008 | Takei et al. | |
| 2010/0171115 A1 | 7/2010 | Nakagawa | |
| 2010/0181554 A1 | 7/2010 | Yoshida et al. | |
| 2010/0265223 A1 | 10/2010 | Asaki et al. | |
| 2012/0080694 A1* | 4/2012 | Yoshida et al. | 257/89 |
| 2013/0062635 A1* | 3/2013 | Higo et al. | 257/88 |
| 2013/0234121 A1* | 9/2013 | Sonoyama | 257/40 |
| 2014/0077196 A1* | 3/2014 | Shim | 257/40 |

FOREIGN PATENT DOCUMENTS

| | | |
|---|---|---|
| JP | 2005-331665 | 12/2005 |
| JP | 2006-134624 | 5/2006 |
| JP | 2007-234581 | 9/2007 |
| JP | 2008-243773 | 10/2008 |
| JP | 2009-176589 | 8/2009 |
| JP | 2010-050107 | 3/2010 |

OTHER PUBLICATIONS

International Search Report in PCT/JP2010/005247, dated Nov. 30, 2010.

International Search Report in PCT/JP2010/005219, dated Nov. 30, 2010.

* cited by examiner

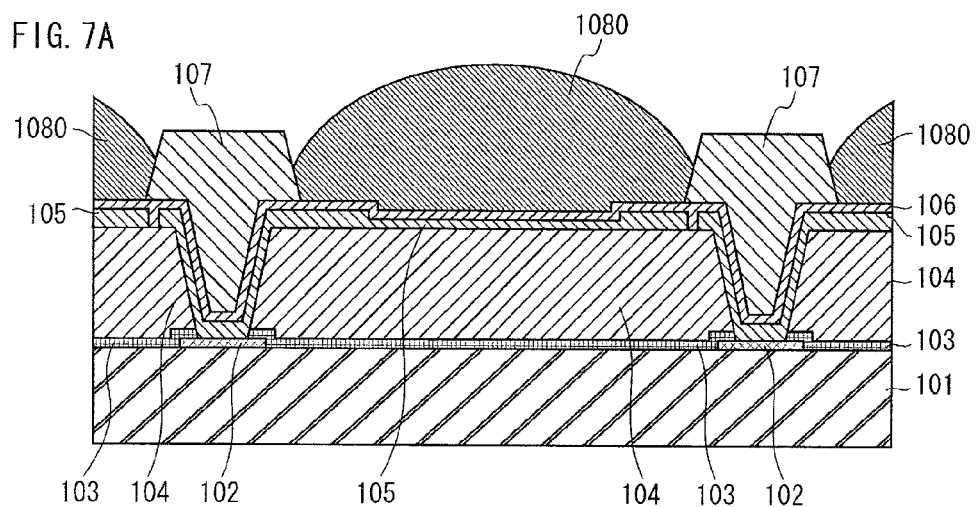
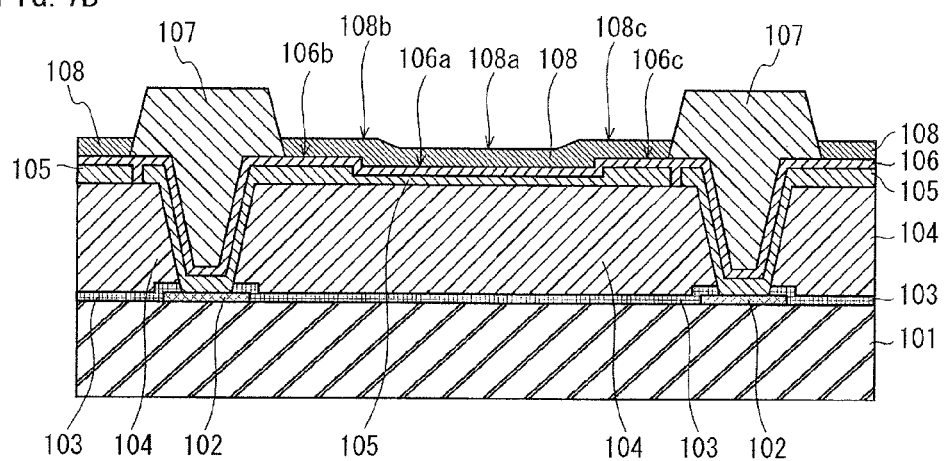
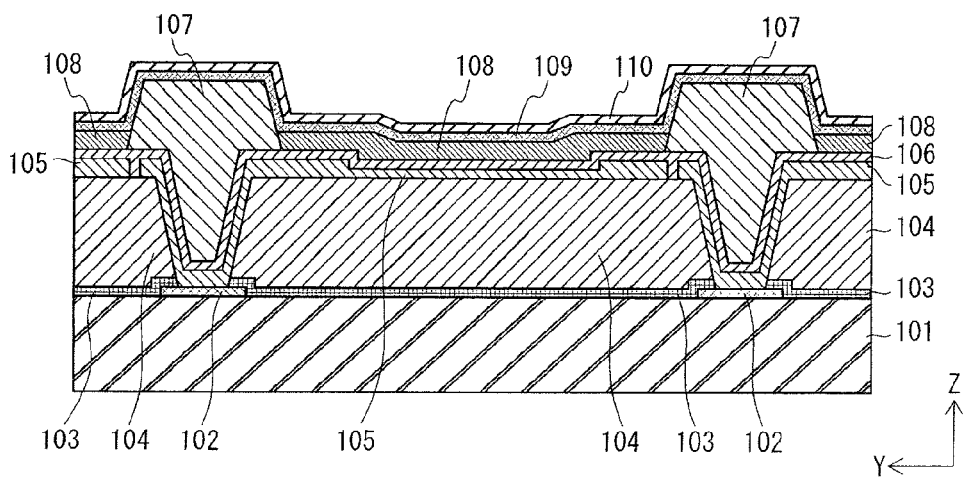

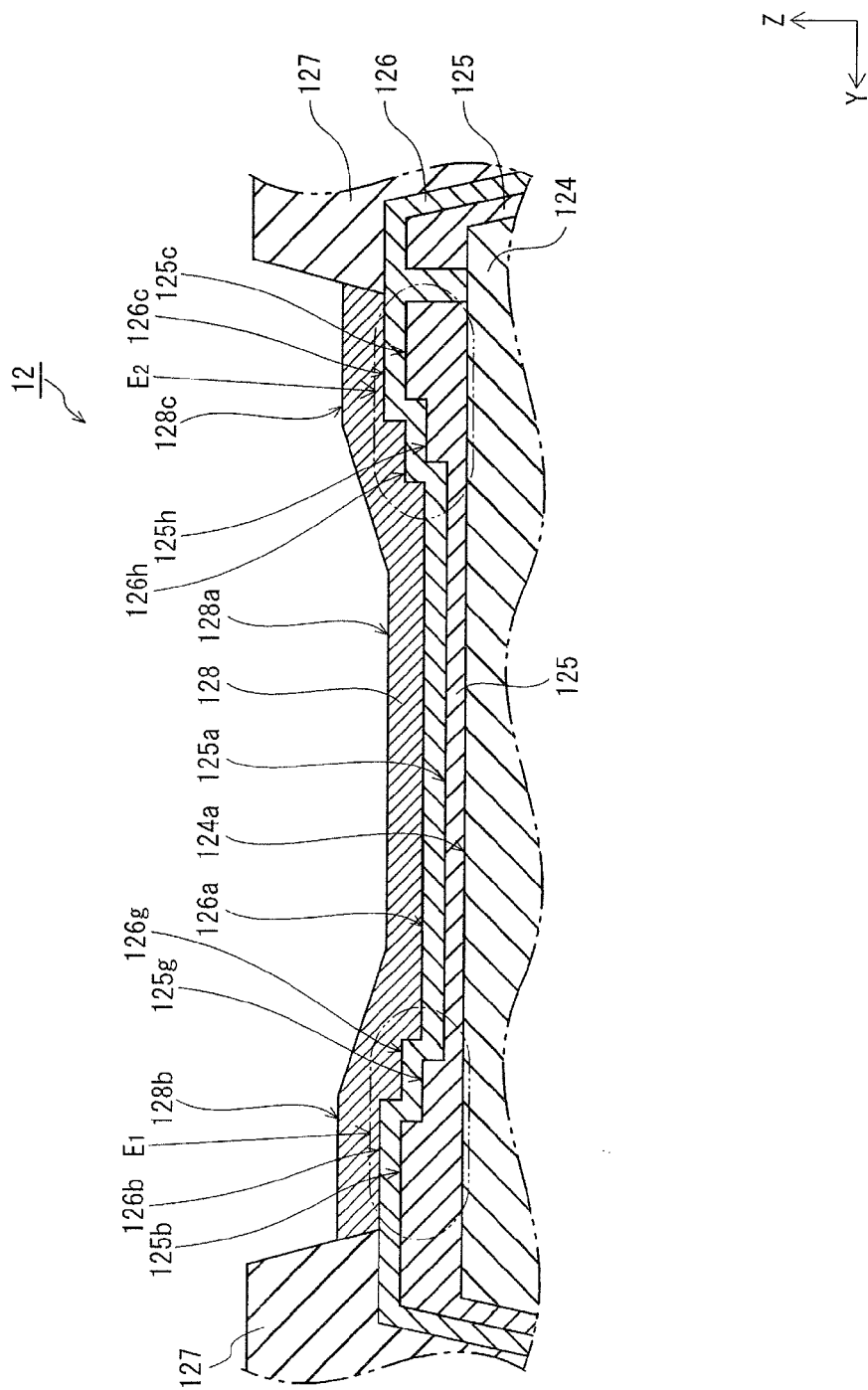

FIG. 14A
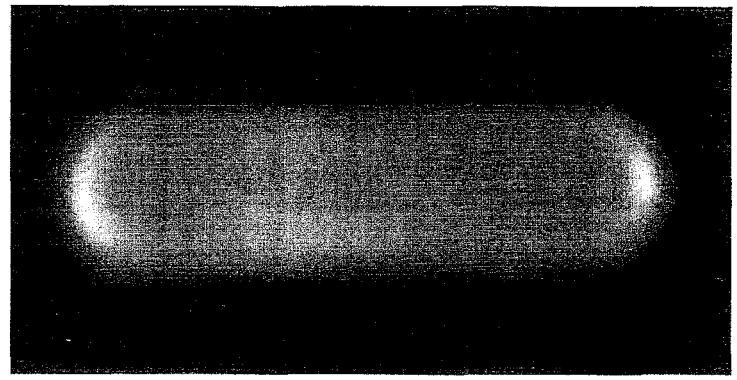
FIG. 14B
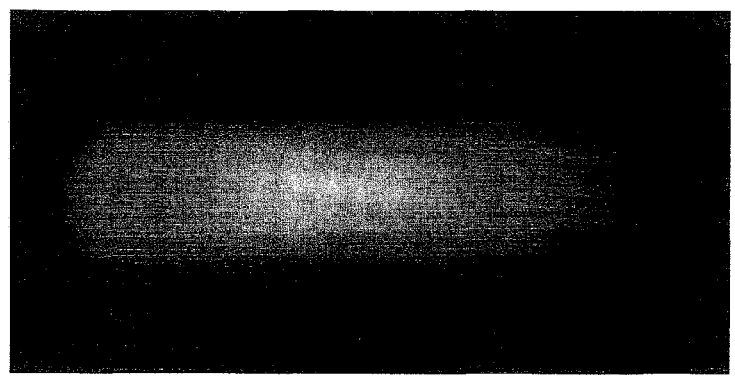
FIG. 14C
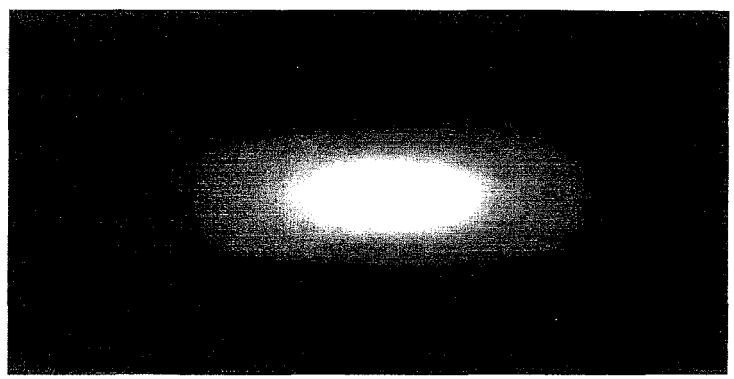
MAX　　　　　Luminance　　　　　0

ORGANIC LIGHT-EMITTING ELEMENT AND MANUFACTURING METHOD OF THE SAME, ORGANIC DISPLAY PANEL, AND ORGANIC DISPLAY DEVICE

This is a continuation application of PCT Application No. PCT/JP2010/005247 filed Aug. 25, 2010, designating the United States of America, the disclosure of which, including the specification, drawings and claims, is incorporated herein by reference in its entirety.

TECHNICAL FIELD

The present invention relates to organic light-emitting elements and a manufacturing method of the same, organic display panels, and organic display devices.

BACKGROUND ART

In recent years, progress has been made in the research and development of display devices that use the phenomenon of electroluminescence occurring in organic material. Each subpixel of such a display device includes an anode and a cathode with an organic light-emitting layer therebetween. When the display device is driven, light is produced when holes and electrons recombine within the organic light-emitting layer after injecting holes through the anode and injecting electrons through the cathode.

The organic light-emitting layer is formed by dripping ink that includes organic light-emitting material into regions partitioned by a bank composed of insulating material and then drying the ink. The thickness of the organic light-emitting layer exhibits a correlation with luminance. Therefore, it is desirable to maintain the thickness of the organic light-emitting layer as uniform as possible.

To satisfy this desire, technology has for example been proposed to provide a gap between the bank and the anode provided therebelow in order to balance affinity and repellency in order to achieve uniformity in the thickness of the organic light-emitting layer (Patent Literature 1). Technology has also been proposed to apply surface treatment, such as oxygen plasma treatment, to the surface of the layer beneath the organic light-emitting layer and to apply surface treatment, such as $CF_4$ plasma treatment, to the surface of the bank in order to achieve uniformity in the thickness of the organic light-emitting layer formed in regions surrounded by these surfaces (Patent Literature 2).

CITATION LIST

Patent Literature

Patent Literature 1: Japanese Patent Application Publication No. 2006-134624
Patent Literature 2: Japanese Patent Application Publication No. 2004-127551

SUMMARY OF INVENTION

Technical Problem

The conventional technology in Patent Literatures 1 and 2, however, does not provide sufficient uniformity in the thickness of the organic light-emitting layer. Specifically, while Patent Literatures 1 and 2 rely on surface treatment of the surface of the bank and the like in order to balance affinity and repellency with respect to the ink that includes the organic light-emitting material, thereby promoting uniformity in the thickness of the organic light-emitting layer, there is a limit on the degree to which variation in the thickness of the organic light-emitting layer can be controlled during drying of the ink.

The present invention has been conceived to contribute towards a solution to the above problems, and it is an object thereof to provide an organic light-emitting element and manufacturing method of the same, an organic display panel, and an organic display device that promote uniformity in the thickness of the organic light-emitting layer and have high optical characteristics and even luminance.

Solution to Problem

An organic light-emitting element according to an aspect of the present invention comprises: an underlayer including a substrate, a drive circuit formed on the substrate, and a planarization layer formed on the drive circuit, an upper surface of the underlayer being planarized; a first electrode above the planarized upper surface of the underlayer; a functional layer above the first electrode; a bank above the first electrode defining an aperture and partitioning adjacent light-emitting cells; a light-emitting layer, formed from ink including organic light-emitting material, above the functional layer at a location corresponding to the aperture defined near the bank; and a second electrode, having opposite polarity from the first electrode, above the light-emitting layer.

The first electrode includes a first upper surface portion and a second upper surface portion, the first upper surface portion corresponding to an edge region of the light-emitting layer near the bank, and the second upper surface portion corresponding to another region removed from the edge region towards a center of the light-emitting layer. The first upper surface portion of the first electrode is located above the second upper surface portion of the first electrode. The functional layer is formed along the first upper surface portion and the second upper surface portion of the first electrode and includes a first upper portion and a second upper portion, the first upper surface portion corresponding to the edge region of the light-emitting layer near the bank, and the second upper surface portion corresponding to the other region removed from the edge region towards the center of the light-emitting layer. The first upper surface portion of the functional layer is located above the second upper surface portion of the functional layer.

The light-emitting layer is formed along the first upper surface portion and the second upper surface portion of the functional layer and includes a first lower surface portion, a second lower surface portion, a first upper surface portion, and a second upper surface portion, the first lower surface portion touching the functional layer and corresponding to the edge region near the bank, the second lower surface portion touching the functional layer and corresponding to the other region removed from the edge region towards the center, the first upper surface portion located opposite the functional layer and corresponding to the edge region near the bank, and the second upper surface portion located opposite the functional layer and corresponding to the other region removed from the edge region towards the center.

The first lower surface portion of the light-emitting layer is located above the second lower surface portion of the light-emitting layer. The first upper surface portion of the light-emitting layer is located above the second upper surface portion of the light-emitting layer. The thickness of the light-emitting layer between the first lower surface portion and the first upper surface portion is equivalent to the thickness of the light-emitting layer between the second lower surface portion and the second upper surface portion.

Advantageous Effects of Invention

In the organic light-emitting element according to an aspect of the present invention, the functional layer is formed along the upper surface (including the first upper surface portion and the second upper surface portion) of the first electrode, and the first upper surface portion of the functional layer is formed to be located above the second upper surface portion of the functional layer. Therefore, in the organic light-emitting element according to an aspect of the present invention, when ink is applied through the aperture and dried to form the organic light-emitting layer, the thickness of the light-emitting layer at the edge regions near the bank becomes equivalent to the thickness at the region removed from the edge region, thus yielding an equivalent thickness throughout the light-emitting cell.

As a result, in the organic light-emitting element according to an aspect of the present invention, the organic light-emitting layer is prevented from becoming thick at the edge regions near the bank, thus preventing the luminance from decreasing in these regions. This makes it easier to obtain uniform luminance throughout the entire light-emitting cell, thereby achieving good light-emitting characteristics.

Furthermore, in the organic light-emitting element according to an aspect of the present invention, the organic light-emitting layer is in contact with the functional layer, which is the same material in the first lower surface portion and the second lower surface portion. This improves wettability of the ink, thereby also contributing to good light-emitting characteristics.

Accordingly, the organic light-emitting element according to an aspect of the present invention promotes a uniform thickness of the light-emitting layer, thus endowing the organic light-emitting element with even luminance and high optical characteristics.

BRIEF DESCRIPTION OF DRAWINGS

FIGS. 7A, 7B, and 7C are schematic cross-section diagrams showing, in order, the main processes in the manufacturing method of the display panel 10.

FIG. 8 is a schematic cross-section diagram showing a subpixel in an organic display panel 12 of an organic display device according to Embodiment 2.

FIGS. 14A, 14B, and 14C are schematic diagrams showing a luminance distribution in the subpixels of the display panel according to the reference example.

DESCRIPTION OF EMBODIMENTS

Figure 1:
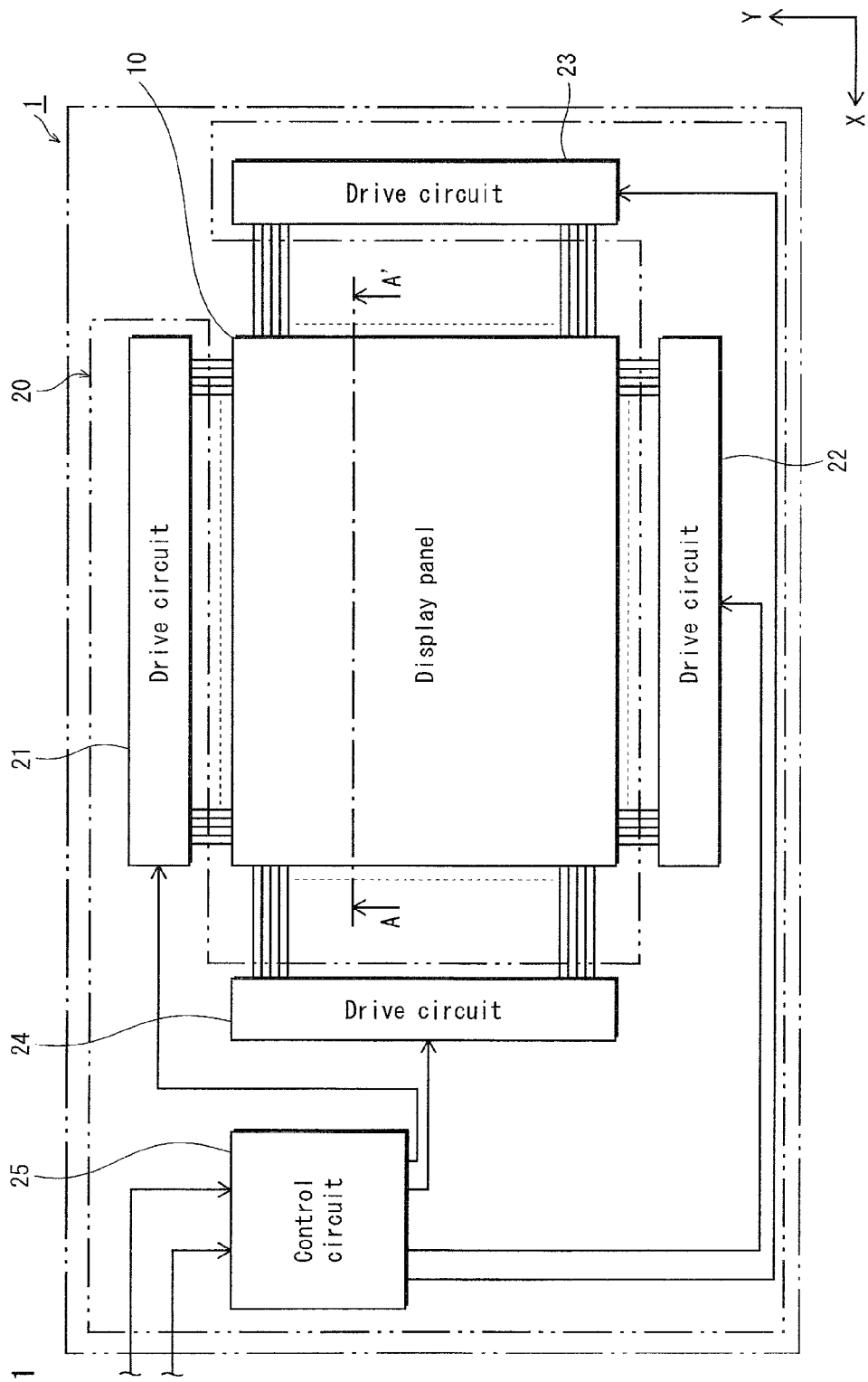
FIG. 1 is a block diagram showing the configuration of an organic display device 1 according to Embodiment 1.

[Outline of an Aspect of the Present Invention]

An organic light-emitting element according to an aspect of the present invention comprises: an underlayer including a substrate, a drive circuit formed on the substrate, and a planarization layer formed on the drive circuit, an upper surface of the underlayer being planarized; a first electrode above the planarized upper surface of the underlayer; a functional layer above the first electrode; a bank above the first electrode defining an aperture and partitioning adjacent light-emitting cells; a light-emitting layer, formed from ink including organic light-emitting material, above the functional layer at a location corresponding to the aperture defined near the bank; and a second electrode, having opposite polarity from the first electrode, above the light-emitting layer.

The first electrode includes a first upper surface portion and a second upper surface portion, the first upper surface portion corresponding to an edge region of the light-emitting layer near the bank, and the second upper surface portion corresponding to another region removed from the edge region towards a center of the light-emitting layer. The first upper surface portion of the first electrode is located above the second upper surface portion of the first electrode. The functional layer is formed along the first upper surface portion and the second upper surface portion of the first electrode and includes a first upper portion and a second upper portion, the first upper surface portion corresponding to the edge region of the light-emitting layer near the bank, and the second upper surface portion corresponding to the other region removed from the edge region towards the center of the light-emitting layer. The first upper surface portion of the functional layer is located above the second upper surface portion of the functional layer.

The light-emitting layer is formed along the first upper surface portion and the second upper surface portion of the functional layer and includes a first lower surface portion, a second lower surface portion, a first upper surface portion, and a second upper surface portion, the first lower surface portion touching the functional layer and corresponding to the edge region near the bank, the second lower surface portion touching the functional layer and corresponding to the other region removed from the edge region towards the center, the first upper surface portion located opposite the functional layer and corresponding to the edge region near the bank, and the second upper surface portion located opposite the functional layer and corresponding to the other region removed from the edge region towards the center.

The first lower surface portion of the light-emitting layer is located above the second lower surface portion of the light-emitting layer. The first upper surface portion of the light-emitting layer is located above the second upper surface portion of the light-emitting layer. The thickness of the light-emitting layer between the first lower surface portion and the first upper surface portion is equivalent to the thickness of the light-emitting layer between the second lower surface portion and the second upper surface portion.

In the organic light-emitting element according to an aspect of the present invention, the functional layer is formed along the upper surface (including the first upper surface portion and the second upper surface portion) of the first electrode, and the first upper surface portion of the functional layer is formed to be located above the second upper surface portion of the functional layer. Therefore, in the organic light-emitting element according to an aspect of the present invention, when ink is applied through the aperture and dried to form the organic light-emitting layer, the thickness of the light-emitting layer at the edge regions near the bank becomes equivalent to the thickness at the region removed from the edge region, thus yielding an equivalent thickness throughout the light-emitting cell.

As a result, in the organic light-emitting element according to an aspect of the present invention, the organic light-emitting layer is prevented from becoming thick at the edge regions near the bank, thus preventing the luminance from decreasing in these regions. This makes it easier to obtain uniform luminance throughout the entire light-emitting cell, thereby achieving good light-emitting characteristics.

Furthermore, in the organic light-emitting element according to an aspect of the present invention, the organic light-emitting layer is in contact with the functional layer, which is the same material in the first lower surface portion and the second lower surface portion. This improves wettability of the ink, thereby also contributing to good light-emitting characteristics.

Accordingly, the organic light-emitting element according to an aspect of the present invention promotes a uniform thickness of the light-emitting layer, thus endowing the organic light-emitting element with even luminance and high optical characteristics.

Note that the word "equivalent" does not necessarily mean exact numerical equality. Rather, the range of "equivalent" values takes into consideration factors such as tolerance during manufacturing of the organic light-emitting element. Specifically, "equivalent" includes a range over which uneven luminance by the organic light-emitting element is allowed.

In the organic light-emitting element according to an aspect of the present invention, an upper surface of the light-emitting layer (including the first upper surface portion and the second upper surface portion) may be concave upwards due to the first upper surface portion of the light-emitting layer being located above the second upper surface portion of the light-emitting layer. A lower surface of the light-emitting layer, including the first lower surface portion and the second lower surface portion, may be convex downwards due to the first lower surface portion of the light-emitting layer being located above the second lower surface portion of the light-emitting layer. With this structure, the upper surface of the light-emitting layer is concave upwards, and the lower surface of the light-emitting layer is convex downwards. Therefore, the thickness of the light-emitting layer is uniform throughout the light-emitting cell. The organic light-emitting element thus has even luminance and high optical characteristics.

In the organic light-emitting element according to an aspect of the present invention, the first upper surface portion of the functional layer may be located above the second upper surface portion of the functional layer by a distance in a range between 100 nm and 200 nm. Providing a difference in height between the first upper surface portion and the second upper surface portion of the functional layer within the above numerical range is preferable from the perspective of guaranteeing uniformity of the thickness of the light-emitting layer.

In the organic light-emitting element according to an aspect of the present invention, when viewing a cross-section of the light-emitting layer between portions of the bank, a length of the first upper surface portion of the light-emitting layer may be at least 50 μm, a length of the second upper surface portion of the light-emitting layer may be at least 50 μm, the length of the first upper surface portion of the light-emitting layer may be between ⅕ and ⅓ an entire length of each light-emitting cell, and the length of the second upper surface portion of the light-emitting layer may be between ⅓ and ⅗ the entire length of each light-emitting cell. Stipulating these numerical ranges further promotes uniformity of the thickness of the light-emitting layer to a high degree of accuracy.

In the organic light-emitting element according to an aspect of the present invention, the second upper surface portion of the first electrode may be planarized, and the first upper surface portion of the first electrode may have a level difference or be formed as a step with respect to the second upper surface portion of the first electrode. With this structure, the second upper surface portion of the first electrode is planarized, which both promotes uniformity of the thickness of the light-emitting layer and prevents collection of emitted light. This achieves high light-emitting characteristics.

In the organic light-emitting element according to an aspect of the present invention, the other region removed from the edge region towards the center of the light-emitting layer may be centered between adjacent portions of the bank.

In the organic light-emitting element according to an aspect of the present invention, the light-emitting cells may be arrayed in two different directions (as a two dimensional array). The bank may be formed in the two different directions so as to partition adjacent light-emitting cells. The first upper surface portion and the second upper surface portion of the first electrode, the first upper surface portion and the second upper surface portion of the functional layer, and the first upper surface portion, the second upper surface portion, the first lower surface portion, and the second lower surface portion of the light-emitting layer may be provided in a direction of length of the light-emitting layer when viewing the light-emitting cell from above. When viewing the light-emitting cell from above, the thickness of the light-emitting layer tends to be uneven between the edge regions near the bank and the region towards the center. With the above structure, the first upper surface portions and the second upper surface portions of each layer, as well as the first lower surface portion and the second lower surface portion of the light-emitting layer are provided in the direction of length of the light-emitting layer when viewing the light-emitting cell from above. This reliably promotes uniformity of the thickness of the light-emitting layer.

A method of manufacturing an organic light-emitting element according to an aspect of the present invention comprises the following steps.

First step: forming a drive circuit on a substrate and forming a planarization layer on the drive circuit in order to form an underlayer that includes the drive circuit and the planarization layer and that has a planarized upper surface.

Second step: forming a first electrode above the planarized underlayer.

Third step: forming a functional layer above the first electrode.

Fourth step: forming a bank above the first electrode to define an aperture and partition adjacent light-emitting cells.

Fifth step: forming a light-emitting layer, above the functional layer at a location corresponding to the aperture defined near the bank, by applying ink that includes organic light-emitting material.

Sixth step: forming a second electrode, having opposite polarity from the first electrode, above the light-emitting layer.

In the second step, the first electrode is formed so that the first electrode includes a first upper surface portion and a second upper surface portion, the first upper surface portion corresponding to an edge region of the light-emitting layer near the bank, and the second upper surface portion corresponding to another region removed from the edge region towards a center of the light-emitting layer, and so that the first upper surface portion of the first electrode is located above the second upper surface portion of the first electrode.

In the third step, the functional layer is formed along the first upper surface portion and the second upper surface portion of the first electrode, is formed to include a first upper portion and a second upper portion, the first upper surface portion corresponding to the edge region of the light-emitting layer near the bank, and the second upper surface portion corresponding to the other region removed from the edge region towards the center of the light-emitting layer, and is formed so that the first upper surface portion of the functional layer is located above the second upper surface portion of the functional layer.

In the fifth step, the light-emitting layer is formed along the first upper surface portion and the second upper surface portion of the functional layer, and is formed to include a first lower surface portion, a second lower surface portion, a first upper surface portion, and a second upper surface portion, the first lower surface portion touching the functional layer and corresponding to the edge region near the bank, the second lower surface portion touching the functional layer and corresponding to the other region removed from the edge region towards the center, the first upper surface portion located opposite the functional layer and corresponding to the edge region near the bank, and the second upper surface portion located opposite the functional layer and corresponding to the other region removed from the edge region towards the center. The first lower surface portion of the light-emitting layer is formed to be located above the second lower surface portion of the light-emitting layer. The first upper surface portion of the light-emitting layer is formed to be located above the second upper surface portion of the light-emitting layer. A thickness of the light-emitting layer between the first lower surface portion and the first upper surface portion is formed to be equivalent to a thickness of the light-emitting layer between the second lower surface portion and the second upper surface portion.

In an organic light-emitting element manufactured with this method of manufacturing, the functional layer is formed along the surface of the first electrode, and the first upper surface portion of the functional layer is located above the second upper surface portion of the functional layer. As a result, in this organic light-emitting element, when ink is applied through the aperture and dried to form the organic light-emitting layer, the thickness of the organic light-emitting layer at the edge regions near the bank becomes equivalent to the thickness at the region removed from the edge region, thus yielding an equivalent thickness throughout the light-emitting cell. Therefore, the organic light-emitting layer is prevented from becoming thick at the edge regions near the bank, thus preventing the luminance from decreasing in these regions. This makes it easier to obtain uniform luminance throughout the entire light-emitting cell, thereby achieving good light-emitting characteristics.

Furthermore, in the organic light-emitting element manufactured with the method of manufacturing according to an aspect of the present invention, the organic light-emitting layer is in contact with the functional layer, which is the same material in the first lower surface portion and the second lower surface portion. This improves wettability of the ink, thereby also contributing to good light-emitting characteristics.

Accordingly, the method of manufacturing an organic light-emitting element according to an aspect of the present invention provides a light-emitting layer with improved uniformity in the thickness, thereby allowing for manufacture of an organic light-emitting element with even luminance and high optical characteristics.

Note that as described above, the word "equivalent" does not necessarily mean exact numerical equality. Rather, the range of "equivalent" values takes into consideration factors such as tolerance during manufacturing of the organic light-emitting element. Specifically, "equivalent" includes a range over which uneven luminance by the organic light-emitting element is allowed.

In the method of manufacturing an organic light-emitting element according to an aspect of the present invention, the second step may include a film formation step of forming, on the underlayer, an electrode film from electrode material for the first electrode, an exposure step of exposing the electrode film at selectively different exposure strengths, and an etching step of forming the first electrode after the exposure step by dry etching the electrode film which adjusting an etching rate so that the first upper surface portion of the first electrode is located above the second upper surface portion of the first electrode.

With this structure, the exposure strength is selectively varied for the electrode film during the exposure step in the second step, thus providing the first upper surface portion and the second upper surface portion on the first electrode. This prevents a reduction in light-emitting characteristics and reliably promotes uniformity in the thickness of the light-emitting layer, thus yielding an organic light-emitting element with good light-emitting characteristics.

An organic display panel according to an aspect of the present invention includes organic light-emitting elements manufactured by the method of manufacturing an organic light-emitting element according to an aspect of the present invention. With the structure, the organic display panel according to an aspect of the present invention provides a light-emitting layer with uniform thickness, thus achieving good light-emitting characteristics.

An organic display device according to an aspect of the present invention includes organic light-emitting elements manufactured by the method of manufacturing an organic light-emitting element according to an aspect of the present invention. With the structure, the organic display device according to an aspect of the present invention provides a light-emitting layer with uniform thickness, thus achieving good light-emitting characteristics.

Note that in this specification, it is preferable that among the first upper surface portions and the second upper surface portions of the various layer, at least the second upper surface portions be planarized.

[Process by which the Present Invention was Achieved]

Figure 12:
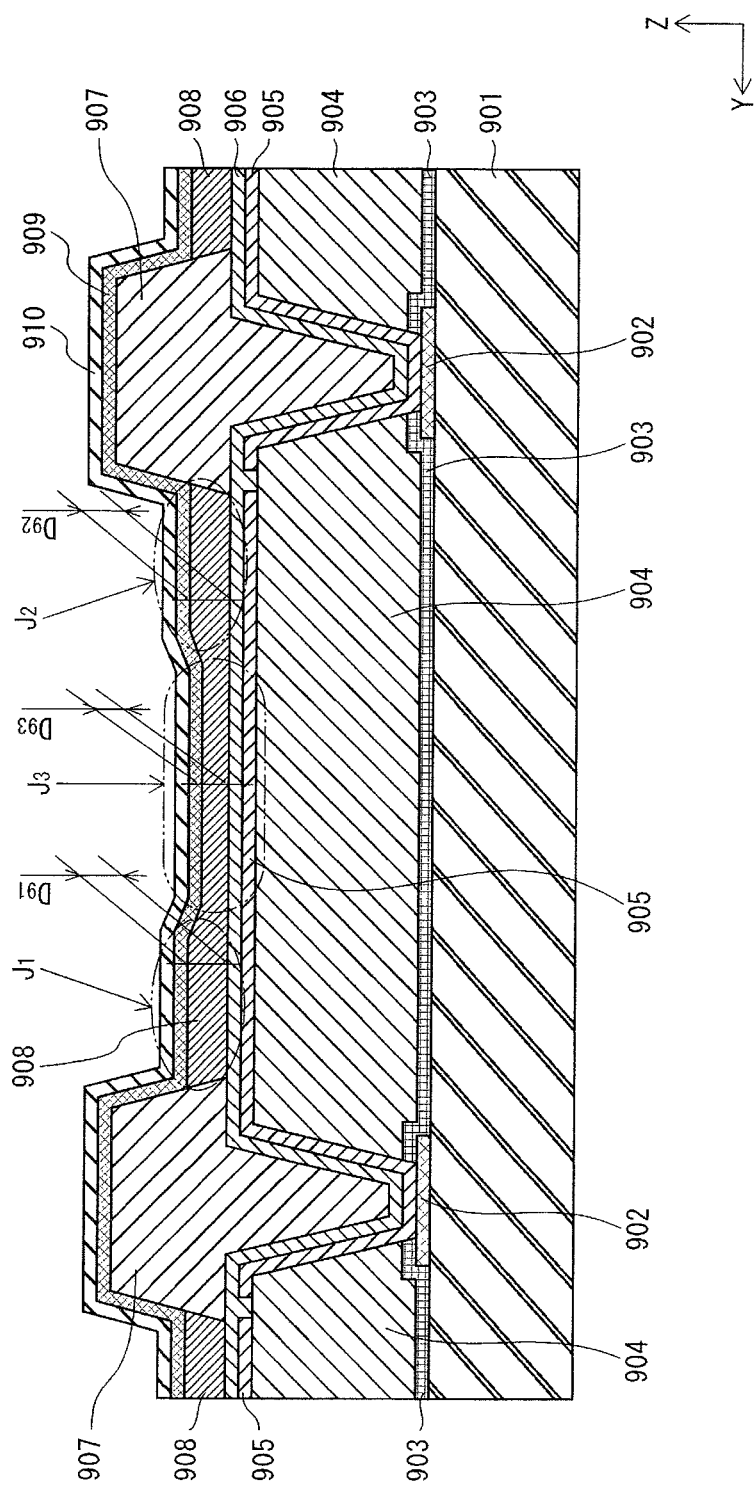
FIG. 12 is a schematic cross-section diagram showing a subpixel in a display panel according to a reference example.

As shown in FIG. 12, a display panel includes a substrate 901 on which a TFT layer 902 is formed as a drive circuit (in FIG. 12, only the drain electrode of the TFT layer 902 is shown). A passivation layer 903 is formed to cover the TFT layer 902. A planarization layer 904 is layered above the passivation layer 903 in the direction of the Z axis. An anode 905 and a hole injection transporting layer 906 are layered in this order on the planarization layer 904. The anode 905, provided independently in each subpixel, is connected to the TFT layer 902 via a contact hole formed in the planarization layer 904.

A bank 907 defining subpixels is provided on the hole injection transporting layer 906. An organic light-emitting layer 908 is formed in each region partitioned near the bank 907. On the exposed surface of the organic light-emitting layer 908 and the bank 907, a cathode 909 and a sealing layer 910 are layered in this order.

Figure 13A:
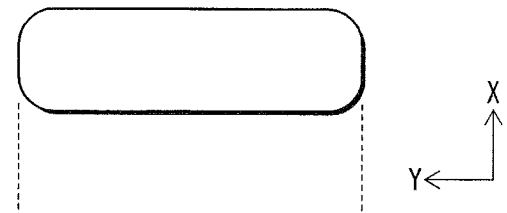
FIGS. 13A, 13B, 13C, and 13D are schematic diagrams showing the surface profile of the organic light-emitting layer in each subpixel of the display panel according to the reference example.

As shown in FIG. 13A, each subpixel is rectangular, being longer in the direction of the Y-axis than the width in the direction of the X-axis. FIG. 12 shows a cross-section of a subpixel in the direction of the Y-axis (the direction of length).

As shown in FIG. 12, in the organic light-emitting layer 908, thicknesses $D_{91}$ and $D_{92}$ at edge regions near the bank 907 at either side in the direction of the Y-axis (regions $J_1$ and $J_2$) tend to be thicker than the thickness $D_{93}$ at a central region (region $J_3$). The difference between the thicknesses $D_{91}$ and $D_{92}$ and the thickness $D_{93}$ in the organic light-emitting layer 908 is inferred to be caused during the process of forming the organic light-emitting layer 908, from the application of ink through drying.

Figure 13B:
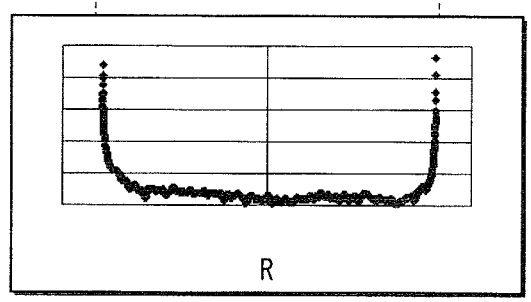
Figure 13C:
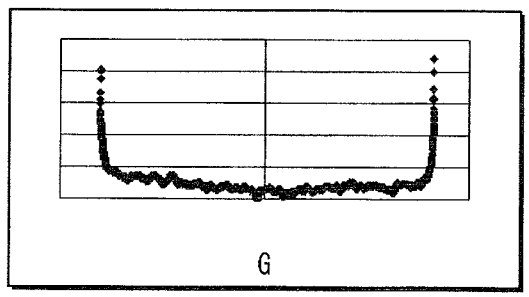
Figure 13D:
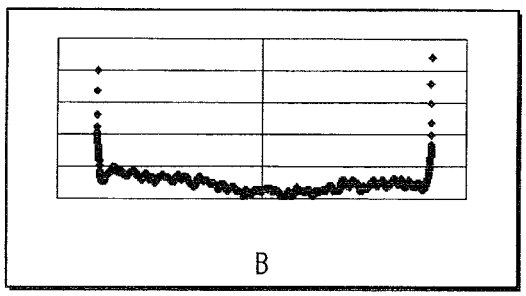

As shown in FIGS. 13B through 13D, the tendency for the thickness of the organic light-emitting layer to increase near the bank 907, i.e. in the edge regions in the direction of length of the subpixel, is the same for all colors, red (R), green (G), and blue (B). The upper surface of the organic light-emitting layer 908 of any color of light is higher at edge regions near the bank 907 than at the central region of the subpixel.

When the thickness of the organic light-emitting layer 908 is not uniform, as in the above case, luminance becomes uneven, leading to a decrease in light-emitting characteristics, as in the red (R) subpixel shown in FIG. 14A, the green (G) subpixel shown in FIG. 14B, and the blue (B) subpixel shown in FIG. 14C. This situation also causes problems such as reduced luminous efficiency and a decrease in service life.

Based on the above considerations, the inventors developed the technical features of structuring the upper surface of the anode (first electrode), located below the organic light-emitting layer in each subpixel of the display panel, to include a first upper surface and a second upper surface having different heights and of forming the functional layer (the hole injection transporting layer and the like) along the upper surface of the underlayer in order to promote uniformity in the thickness of the organic light-emitting layer formed on the functional layer.

Figure 15A:
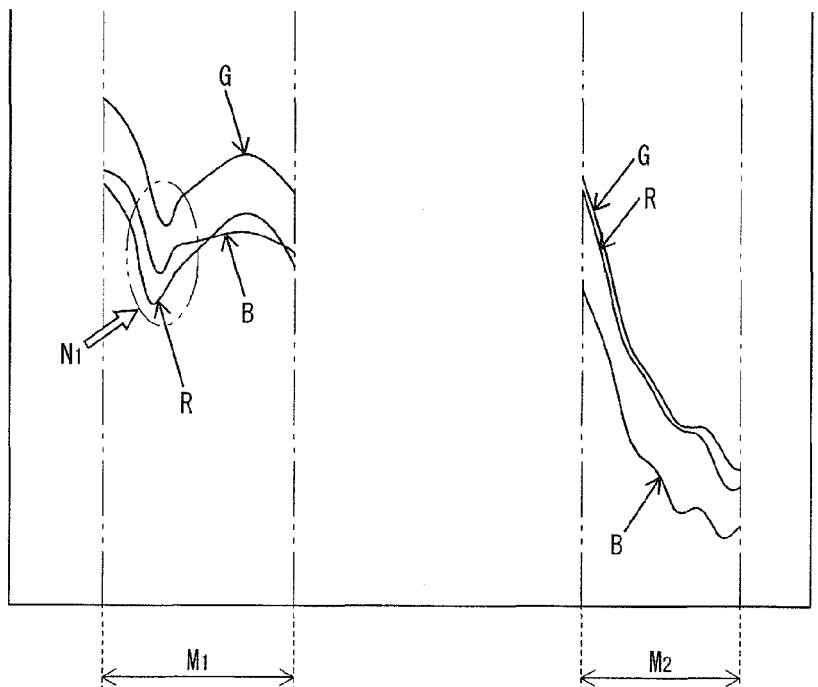
FIGS. 15A, 15B, and 15C are schematic diagrams showing the surface profile of regions in a lower electrode (first electrode) of the display panel according to the reference example and the luminance distribution in those regions.

The conclusions drawn from considering the relationship between luminance and the surface profile (upper surface portion) of the lower electrode formed on the underlayer are described with reference to FIGS. 15A through 15C. FIG. 15A shows the surface profile (upper surface portion) of the lower electrode in partial regions of the subpixel (region $M_1$ and region $M_2$). Specifically, these regions correspond to the profile of section K-K' in FIG. 15B. In FIG. 15A, the vertical axis represents the thickness of the underlayer, with thickness increasing higher up the vertical axis. The horizontal axis represents the corresponding region of the underlayer.

Figure 15B:
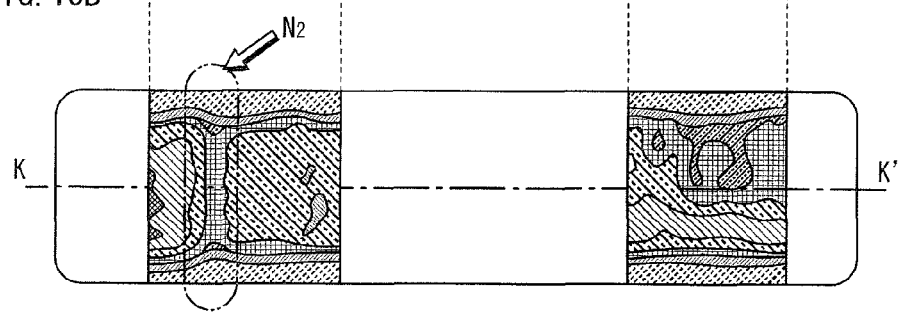
Figure 15C:

FIG. 15B shows a luminance distribution in the above partial regions (region $M_1$ and region $M_2$), using a blue (B) subpixel as an example. FIG. 15C indicates the luminance levels depicted in FIG. 15B.

In the region $M_2$ shown in FIG. 15A, the surface profile of the lower electrode (first electrode) is curved, but as shown in FIG. 15B, the luminance in the corresponding region (region $M_2$) is approximately uniform. Accordingly, as in the region $M_2$ in FIG. 15A, when the surface profile of the lower electrode is curved, the thickness of the light-emitting layer can be considered to be greater at the edges of the subpixel than at the central region.

On the other hand, as in the region $M_1$ in FIG. 15A, when the surface profile of the lower electrode changes approximately continuously by a step or a level difference, then as shown in FIG. 15B, the luminance in the corresponding region (region $M_1$) changes. Specifically, in a region in which the lower electrode is thin and the surface profile is low, as in the region $N_1$ of FIG. 15A, circled by a line with alternate long and two short dashes, luminance is low, as in region $N_2$ of FIG. 15B, which is also circled by a line with alternate long and two short dashes. In other words, a relationship is considered to exist whereby the lower electrode is thicker at a portion where luminance is high than at a portion where luminance is low.

Accordingly, as described above, it is preferable to adopt a structure in which the second upper surface portion (upper surface portion by the central region) of the lower electrode (first electrode) is flat, and the first upper surface portion (upper surface portion by the edge) has a level difference with respect to the second upper surface portion, or is formed as a step. By adopting this sort of structure, the thickness of the light-emitting layer in the subpixel can be made uniform, thus achieving high light-emitting characteristics.

Embodiment 1

1. Configuration of Display Device 1

The overall structure of the display device 1 according to the present Embodiment is described with reference to FIG. 1.

As shown in FIG. 1, the display device (organic display device) 1 is composed of a display panel (organic display panel) 10 and a drive control unit 20 connected to the display panel 10. The display panel 10 is an organic display panel using the phenomenon of electroluminescence of organic material. A plurality of pixels are arranged in a two-dimensional matrix in the X and Y directions.

The drive control unit 20 is composed of four drive circuits 21-24 and a control circuit 25.

Note that in an actual display device 1, the placement of the drive control unit 20 with respect to the display panel 10 is not limited in this way.

2. Structure of Display Panel 10

Figure 2:
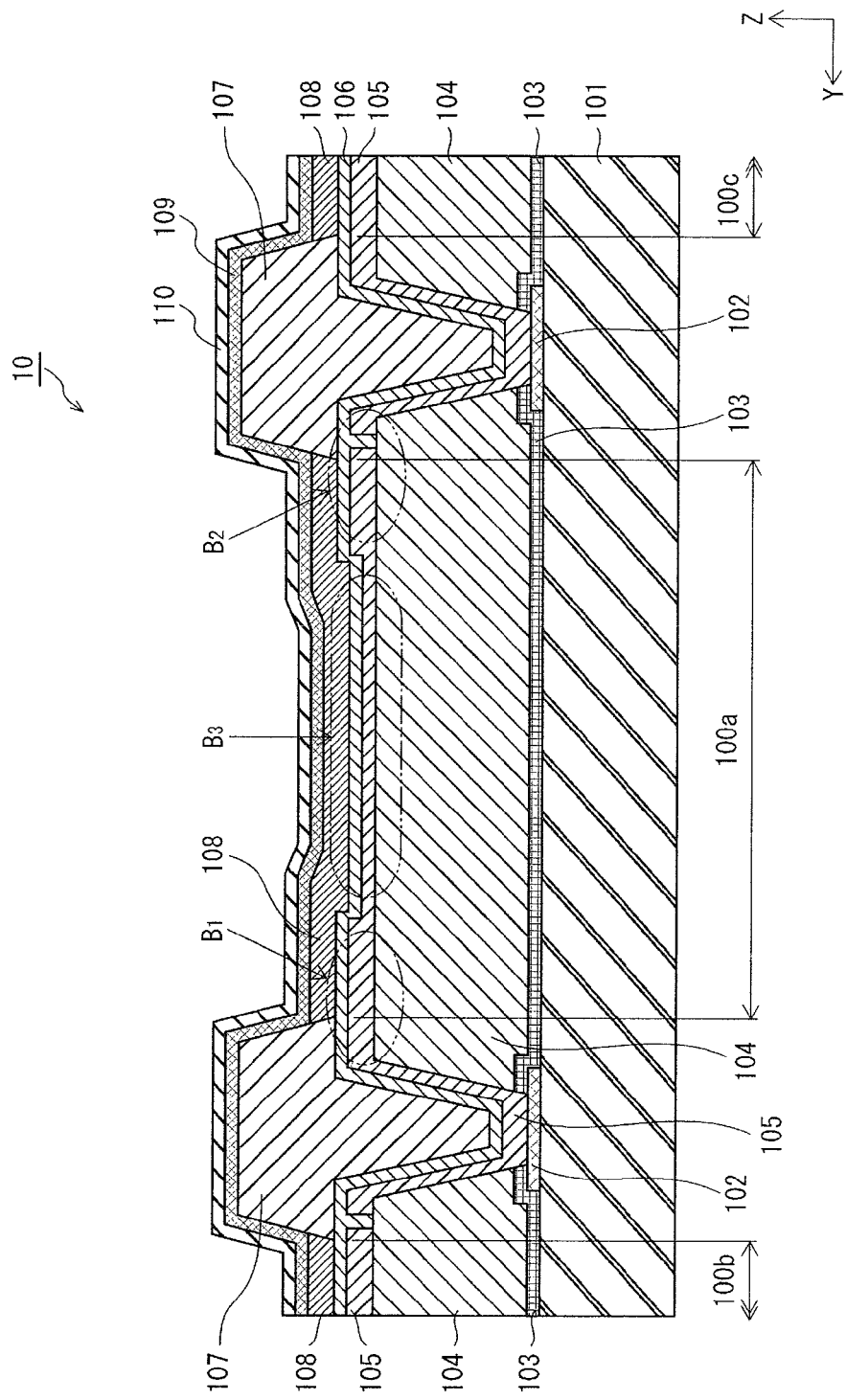
FIG. 2 is a schematic cross-section diagram showing a subpixel 100a in the organic display panel 10.

The structure of the display panel 10 is described with reference to FIG. 2. As an example, the display panel 10 in the present Embodiment is a top emission type organic EL panel composed of a plurality of subpixels arranged in a matrix and each provided with an organic light-emitting layer having a luminescent color of red (R), green (G), or blue (B). FIG. 2 schematically depicts a portion of an A-A' cross-section in FIG. 1, focusing on three adjacent subpixels 100a, 100b, and 100c.

As shown in FIG. 2, the display panel 10 has a TFT layer 102, which is a drive circuit, formed on the substrate 101 in the direction of the Z-axis. Note that in FIG. 2, only the drain electrode among the constituent elements of the TFT layer 102 is shown. A passivation layer 103 is formed on the TFT layer 102 and on the substrate 101. The passivation layer 103 has openings to expose portions of the TFT layer 102.

A planarization layer 104, an anode 105 and a hole injection transporting layer 106 are layered in this order on the passivation layer 103. The anode 105 is provided separately for each of the subpixels 100a, 100b, and 100c.

A bank 107, formed from an insulating material, is provided on the hole injection transporting layer 106 to partition the subpixels 100a, 100b, and 100c. An organic light-emitting layer 108 is formed in each region partitioned by adjacent portions of the bank 107, and a cathode 109 and sealing layer 110 are layered on the organic light-emitting layer 108 in this order. The main constituent elements are, for example, formed from the following materials.

Note that as shown in FIG. 2, the anode 105 is thicker at edge regions near the bank 107 (regions $B_1$ and $B_2$) than at a central region (region $B_3$) that is removed from the edge regions near the bank 107 towards the center of the anode 105. Details regarding this difference in thickness are provided below.

a) Substrate 101

The substrate 101 is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicon resin, alumina, etc.

b) Planarization Layer 104

The planarization layer 104 is formed from an organic compound such as polyimide, polyamide, or an acrylic resin material.

c) Anode 105

The anode 105 is composed of a single layer or of a laminate of a plurality of layers of a conductive material, such as Al (aluminum) or an aluminum alloy, Ag (silver), APC (alloy of silver, palladium, and copper), ARA (alloy of silver, rubidium, and gold), MoCr (alloy of molybdenum and chromium), NiCr (alloy of nickel and chromium), etc. Note that in the case of a top emission type panel such as in the present embodiment, it is preferable that the anode 105 be formed with highly reflective material.

A transparent coating layer formed from, for example, indium tin oxide (ITO) may be included in the upper layer portion of the anode 105.

d) Hole Injection Transporting Layer 106

The hole injection transporting layer 106 is a layer of an oxide such as silver (Ag), molybdenum (Mo), chromium (Cr), vanadium (V), tungsten (W), nickel (Ni), iridium (Ir), or the like, or formed from a conductive polymer material, such as PEDOT (a mixture of polythiophene and polystyrene sulfonate) or the like. Among the above materials, a hole injection transporting layer 104 formed from such a metal oxide has the function of assisting with hole generation and of injecting and transporting holes stably into the organic light-emitting layer 106. The hole injection transporting layer 104 has a high work function.

When the hole injection transporting layer 106 is formed from an oxide of a transition metal, a plurality of levels can be occupied since there are a plurality of oxidation numbers. This makes hole injection easy and allows for reduction of driving voltage.

e) Bank 107

The bank 107 is formed with an organic material, such as resin, and has insulating properties. Examples of the organic material used to form the bank 107 include acrylic resin, polyimide resin, styrenic resin, polycarbonate resin, novolactype phenolic resin, and the like. It is also preferable that the bank 107 have organic solvent resistance.

Furthermore, since the bank 107 is etched and baked when formed, it is preferable that the bank be formed from highly resistant material that will not change in shape or quality during the etching and baking processes. To provide the bank with liquid repellency, the side walls can be fluoridated.

Note that as the insulating material used in forming the bank 107, any liquid repellent material with a resistivity of $10^5$ $\Omega \cdot cm$ or greater can be used, starting with the above materials. Using a material with a resistivity of less than $10^5$ $\Omega \cdot cm$ leads to production of leak current between the anode 105 and the cathode 109, or between adjacent subpixels 100a, 100b, and 100c, which causes a variety of problems such as increased power consumption.

Furthermore, if a hydrophilic material is used to form the bank 107, then the difference in liquid affinity/repellency between the side wall of the bank 107 and the surface of the hole injection transporting layer 106 becomes small, and it thus becomes difficult to selectively maintain the ink, which includes an organic substance for forming the organic light-emitting layer 108, at the opening of the bank 107.

The structure of the bank 107 need not be a single layer as shown in FIG. 2, but may adopt a two or more layered structure. In such a case, the above materials may be combined for each layer, or layers may alternate between non-organic and organic material.

f) Organic Light-Emitting Layer 108

The organic light-emitting layer 108 has a function of emitting light when an excitation state is produced by the recombination of holes injected through the anode 105 with electrons injected through the cathode 109. The material used to form the organic light-emitting layer 108 needs to be a light emitting organic material, a film of which can be formed by wet printing.

Specifically, it is preferable that the organic light emitting layer 106 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, or the like, as recited in Japanese Patent Application Publication No. H5-163488.

g) Cathode 109

The cathode 109 is formed, for example, of ITO, indium zinc oxide (IZO), or the like. In the case of the top-emission type display panel 10, it is preferable that the cathode 109 be formed with a transparent material. It is preferable that the degree of transparency be 80% or greater.

The material used to form the cathode 109 may, in addition to the above materials, be for example an alkali metal or alkali earth metal, or a laminate structure having, in the following order, a layer that includes a halide of an alkali metal or alkali earth metal and a layer that includes silver. The layer that includes silver may be formed with silver alone, or with a silver alloy. Also, in order to increase light takeoff efficiency, a highly transparent refraction index adjustment layer may be provided above the layer that includes silver.

An electron injection layer may also be inserted between the organic light-emitting layer 108 and the cathode 109.

The electron injection layer has the function of transporting electrons injected through the cathode 109 to the organic light-emitting layer 108 and is preferably formed, for example, of barium, phthalocyanine, lithium fluoride, or a combination thereof.

h) Sealing Layer 110

The sealing layer 110 has the function of controlling the organic light-emitting layer 108 or other layers from being exposed to water or air and is formed, for example, with silicon nitride (SiN), silicon oxynitride (SiON), or the like. In the case of the top-emission type display panel 10, it is preferable that the sealing layer 110 be formed with a transparent material.

3. Structure of Bank 107

Figure 3:
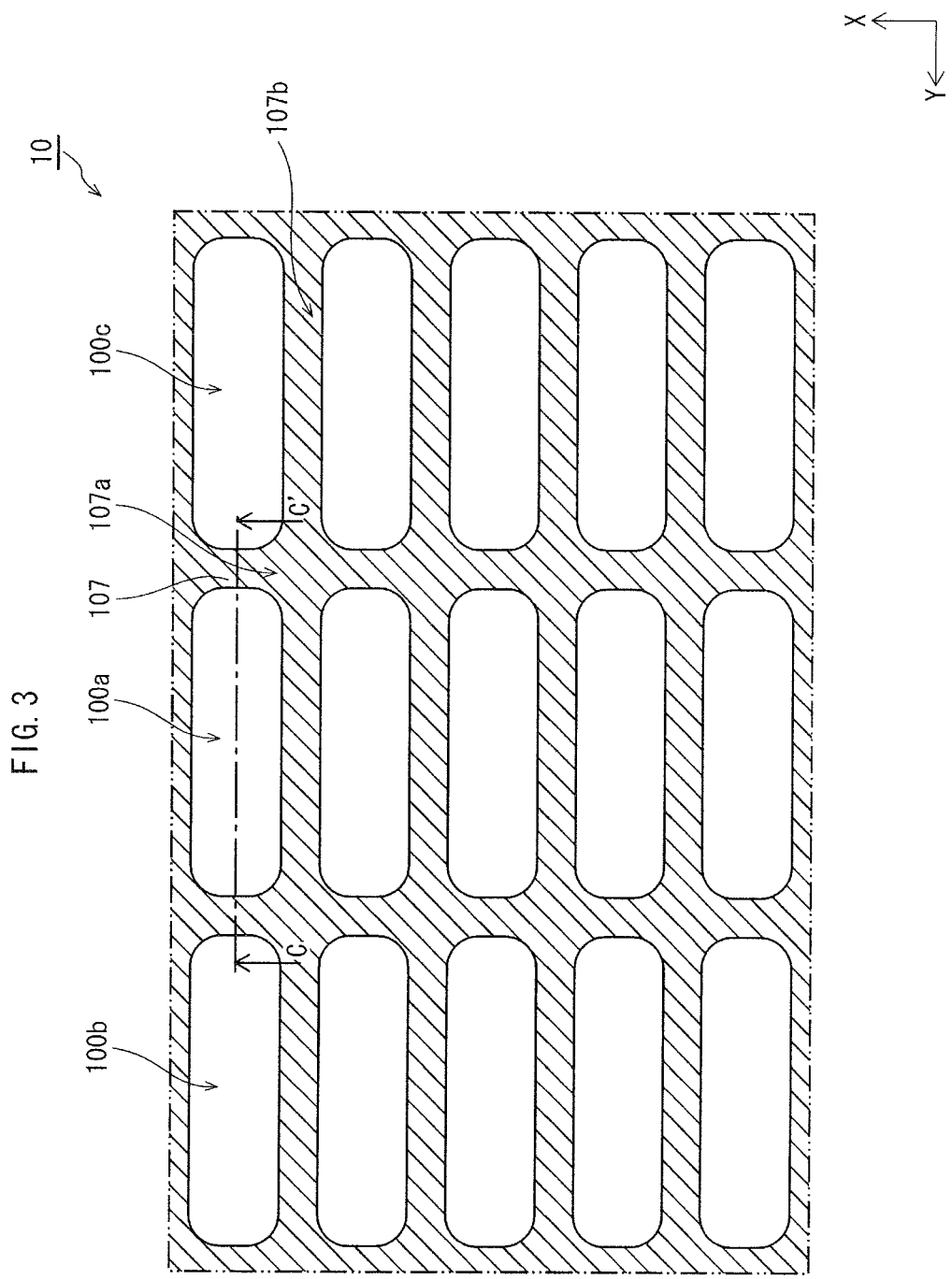
FIG. 3 is a schematic plan view showing a portion of a bank 107 in the display panel 10.

As shown in FIG. 3, in the display panel 10 according to the present embodiment, the bank 107 is a so-called pixel bank that defines the subpixels 100a, 100b, and 100c into approximately rectangular regions. Specifically, the bank 107 is integrally formed from portions 107a that extend in the direction of the X-axis and portions 107b that extend in the direction of the Y-axis. Three subpixels that are adjacent in the direction of the X-axis and belong to the same column (a red (R) subpixel, a green (G) subpixel, and a blue (B) subpixel) together form one pixel.

Note that the cross-section shown in FIG. 2 is the C-C' cross-section in FIG. 3. In other words, a cross-section of the subpixel 100a is shown in the direction of length thereof (the direction of the Y-axis).

4. Shape of Anode 105 and Thickness of Organic Light-Emitting Layer 108

Figure 4:
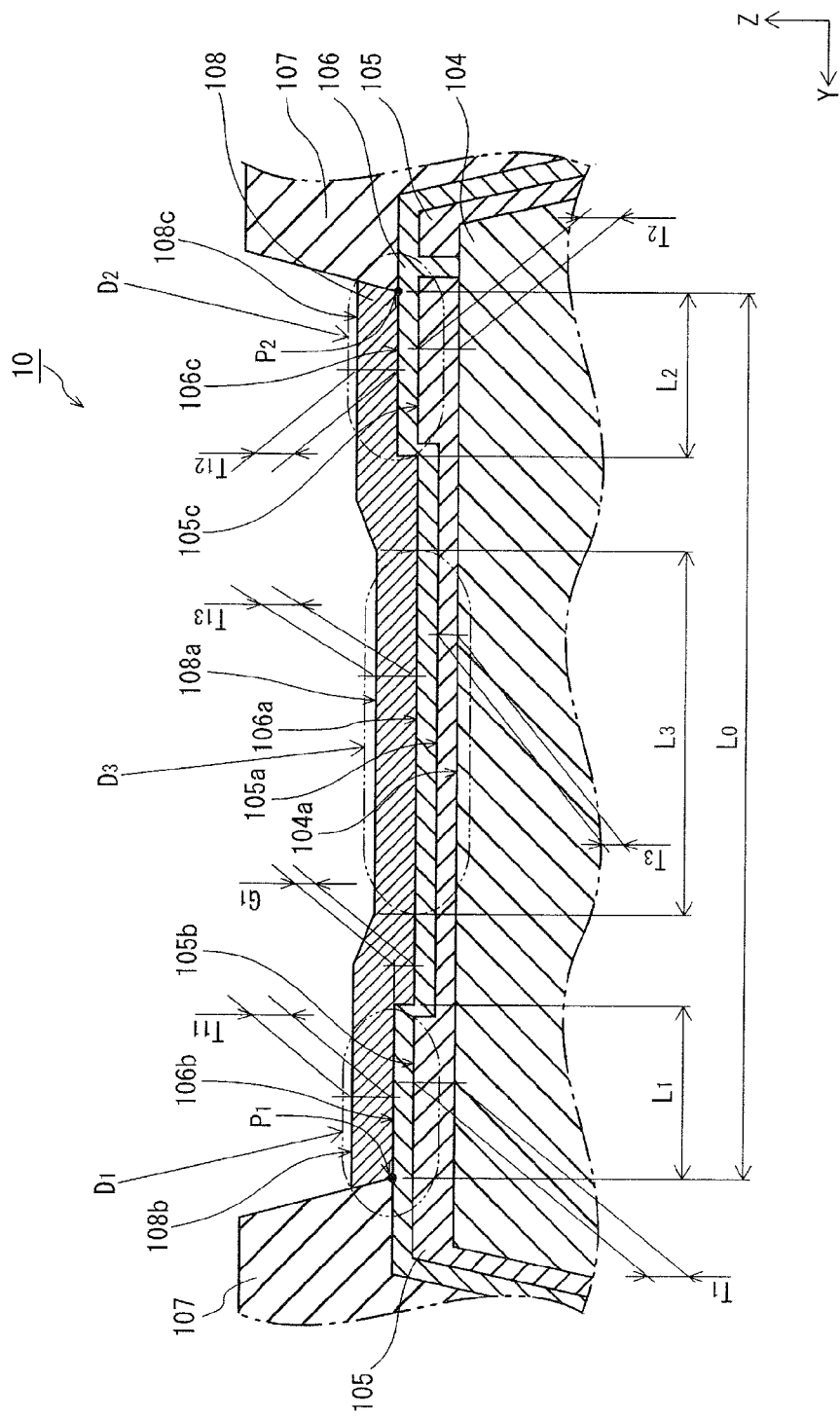
FIG. 4 is a schematic cross-section diagram showing the shape of a planarization layer 104, an anode 105, a hole injection transporting layer 106, and an organic light-emitting layer 108.

As shown in FIG. 4, in each of the subpixels 100a, 100b, and 100c of the display panel 10, the anode 105 that is formed on the planarization layer 104 with a planarized upper surface 104a does not have an even thickness throughout. Rather, a thickness $T_1$ and $T_2$ at edge regions near the bank 107 (regions $D_1$ and $D_2$) is greater than a thickness $T_3$ at a central region (region $D_3$) that is removed from the edge regions near the bank 107 towards the center.

The upper surface 104a of the planarization layer 104 is planarized in a light-emitting region between portions of the bank 107. Accordingly, due to the difference between the thicknesses $T_1$ and $T_2$ and the thickness $T_3$, upper surface portions 105b and 105c of the anode 105, respectively in the regions $D_1$ and $D_2$, are located higher in the direction of the Z-axis than an upper surface portion 105a in the region $D_3$.

The hole injection transporting layer 106 is layered along the upper surface portions 105a, 105b, and 105c of the anode 105, and the thickness is approximately uniform. Therefore, upper surface portions 106b and 106c at edge regions near the bank 107 are located higher in the direction of the Z-axis than an upper surface portion 106a at the central region.

As for the organic light-emitting layer 108 layered on the hole injection transporting layer 106, as described above, upper surface portions 108b and 108c in the edge regions (regions $D_1$ and $D_2$) near the bank 107 are located higher in the direction of the Z-axis than an upper surface portion 108a at the central region (region $D_3$).

In the present embodiment, as shown in FIG. 4, in the hole injection transporting layer 106, the upper surface portions 106b and 106c at edge regions near the bank 107 are located higher in the direction of the Z-axis than the upper surface portion 106a at the central region. Therefore, lower surface portions of the organic light-emitting layer 108 at the edge regions (regions $D_1$ and $D_2$), which are touching and thus equivalent to the upper surface portions 106b and 106c of the hole injection transporting layer 106, are located higher in the direction of the Z-axis than a lower surface portion at the central region (region $D_3$), which is similarly equivalent to the upper surface portion 106a of the hole injection transporting layer 106. As a result, thicknesses $T_{11}$ and $T_{12}$ of the organic light-emitting layer 108 in the edge regions (regions $D_1$ and $D_2$) are equivalent to a thickness $T_{13}$ of the organic light-emitting layer 108 at the central region (region $D_3$).

When viewed as a whole, the upper surface portion of the organic light-emitting layer 108 is concave upwards along the Z-axis, and the bottom surface portion is convex downward along the Z-axis.

Note that the word "equivalent" does not necessarily mean exact numerical equality. Rather, the range of "equivalent" values takes into consideration factors such as tolerance during manufacturing of the organic light-emitting element. Specifically, "equivalent" includes a range over which uneven luminance by the organic light-emitting element is allowed.

In the hole injection transporting layer 106, the upper surface portions 106b and 106c at the edge regions (regions $D_1$ and $D_2$) near the bank 107 are located higher, in the direction of the Z-axis, than the upper surface portion 106a at the central region (region $D_3$) by a difference (gap) $G_1$. The gap $G_1$ is defined as being within a range from 100 nm to 200 nm. This allows for the thicknesses $T_{11}$ and $T_{12}$ and the thickness $T_{13}$ to be reliably made uniform in the organic light-emitting layer 108.

In terms of promoting uniformity of the thicknesses $T_{11}$ and $T_{12}$ and the thickness $T_{13}$, it is also preferable that in the organic light-emitting layer 108, the upper surface portions 108b and 108c at the edge regions (regions $D_1$ and $D_2$) near the bank 107 be at least 50 μm long in the direction of the Y-axis. Similarly, in terms of promoting uniformity of the thicknesses $T_{11}$ and $T_{12}$ and the thickness $T_{13}$, it is also preferable that in the organic light-emitting layer 108, the upper surface portion 108a at the central region (region $D_3$) be at least 50 μm long in the direction of the Y-axis.

Letting the length of the subpixel in the direction of the Y-axis $L_0$ be defined as the distance between intersection points $P_1$ and $P_2$, at which inclined faces of the bank 107 meet the upper surface portions 106b and 106c of the hole injection transporting layer 106, then in terms of promoting uniformity of the thicknesses $T_{11}$ and $T_{12}$ and the thickness $T_{13}$, it is preferable that the upper surface portions 108b and 108c at the edge regions (regions $D_1$ and $D_2$) near the bank 107 be between ⅕ and ⅓ the length $L_0$. Similarly, in terms of promoting uniformity of the thicknesses $T_{11}$ and $T_{12}$ and the thickness $T_{13}$, it is also preferable that in the organic light-emitting layer 108, the upper surface portion 108a at the central region (region $D_3$) be between ⅓ and ⅗ the length $L_0$.

5. Advantageous Effects

In the organic display device 1 and the display panel 10 according to Embodiment 1, the thicknesses $T_{11}$ and $T_{12}$ and the thickness $T_{13}$ of the organic light-emitting layer 108 are equivalent in each of the subpixels 100a, 100b, and 100c. As a result, in the display panel 10, the organic light-emitting layer 108 in each of the subpixels 100a, 100b, and 100c is prevented from becoming thick at the edge regions (regions $D_1$ and $D_2$) near the bank 107, thus preventing the luminance from decreasing in these regions. This makes it easier to obtain uniform luminance throughout the subpixels 100a, 100b, and 100c, thereby achieving good light-emitting characteristics.

In the display panel 10, the organic light-emitting layer 108 is in contact with the hole injection transporting layer 106, which is the same material in the lower surface portions at the edge regions (regions $D_1$ and $D_2$) near the bank 107 and the lower surface portion at the central region (region $D_3$). This improves wettability of the ink, thereby also contributing to good light-emitting characteristics.

Accordingly, the organic display device 1 and the display panel 10 according to Embodiment 1 promote a uniform thickness of the organic light-emitting layer 108, including the thicknesses $T_{11}$ and $T_{12}$ and the thickness $T_{13}$, throughout the subpixels 100a, 100b, and 100c. The organic display device 1 and the display panel 10 thus have even luminance and high optical characteristics.

6. Manufacturing Method

The main portions of a manufacturing method of the display panel 10 are described with reference to FIGS. 5A through 7C.

Figure 5A:
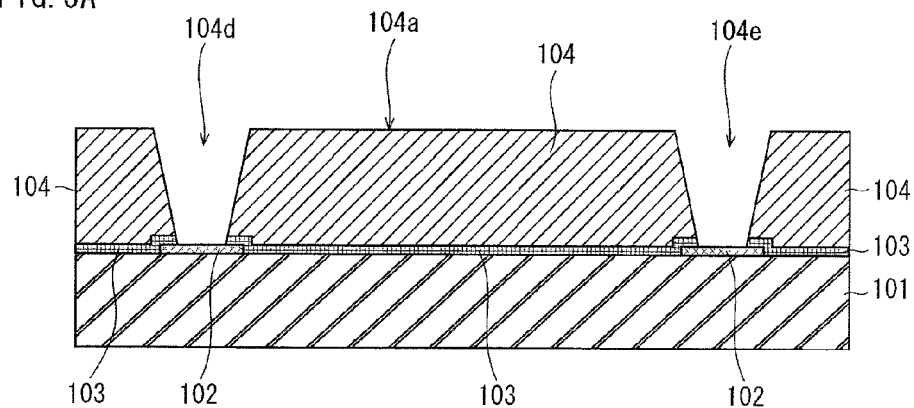
FIGS. 5A, 5B, and 5C are schematic cross-section diagrams showing, in order, the main processes in the manufacturing method of the display panel 10.

As shown in FIG. 5A, the TFT layer 102 is formed on the main upper surface, in the direction of the Z-axis, of the substrate 101 (in FIGS. 5A through 7C, only the drain electrode of the TFT layer 102 is shown). The passivation layer 103 is formed thereabove. The planarization layer 104, made from an organic compound (such as polyimide, polyamide, or the like), is formed on the passivation layer 103. In the planarization layer 104, contact holes 104d and 104e are formed at the upper portion of the drain electrode in the TFT layer 102.

At the bottom of the contact holes 104d and 104e, a portion of the passivation layer 103 is also removed so as to expose the drain electrode of the TFT layer 102.

Figure 5B:
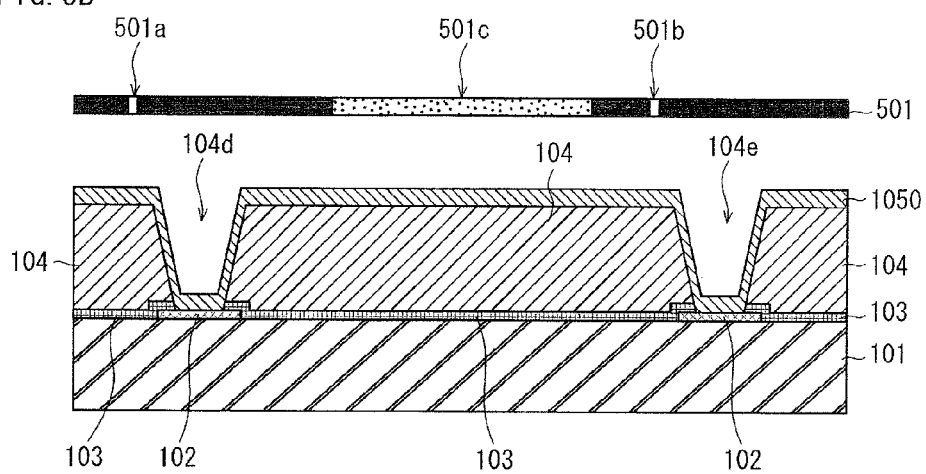

Next, as shown in FIG. 5B, an electrode film 1050 is formed on the planarization layer 104 in order to form the anode 105. The electrode film 1050 is formed by the sputtering method or the vacuum deposition method using conductive material (such as aluminum (Al) or an alloy including aluminum). Note that the electrode film 1050 is also formed on the inner walls of the contact holes 104d and 104e and is in contact with the drain electrode of the TFT layer 102 at the bottom of the contact holes 104d and 104e.

As shown in FIG. 5B, a mask 501 is disposed after the electrode film 1050 has been formed on the planarization layer 104.

Optical transmission sections 501a, 501b, 501c, and the like are provided in the mask 501. The mask 501 is a so-called half-tone mask, in which the optical degree of transparency is set lower in the optical transmission section 501c than in the optical transmission sections 501a and 501b.

Figure 5C:
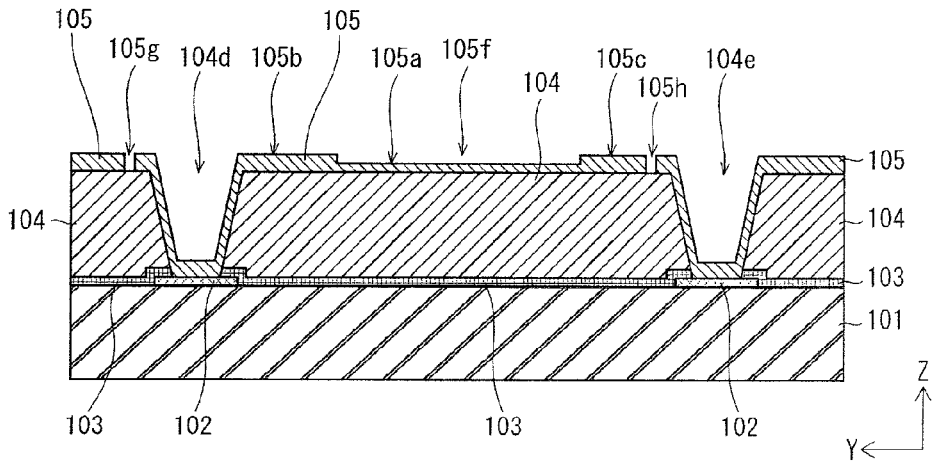

In the state shown in FIG. 5B, exposure is performed, followed by etching. During the exposure process, the exposure strength is selectively varied due to the above-described difference in optical degree of transparency between the optical transmission sections 501a and 501b and the optical transmission section 501c in the mask 501. As a result, the anode 105 is separated into units of subpixels between locations corresponding to the optical transmission sections 501a and 501b in the mask 501 (locations 105g and 105h) after etching, as shown in FIG. 5C. On the other hand, at each location corresponding to the optical transmission section 501c of the mask 501, a concavity 105f in the anode 105 is formed after etching, due to the exposure strength being relatively weak.

In the anode 105, the upper surface portion 105a at the bottom of the concavity 105f differs in height over a range from 100 nm to 200 nm as compared to the upper surface portions 105b and 105c in the edge portions in the direction of the Y-axis.

Note that Indium Tin Oxide (ITO) or the like may be further layered on the anode 105.

Figure 6A:
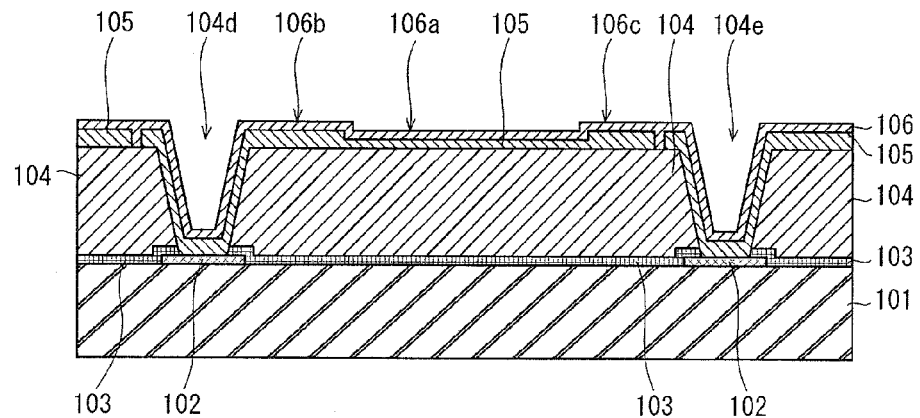
FIGS. 6A, 6B, and 6C are schematic cross-section diagrams showing, in order, the main processes in the manufacturing method of the display panel 10.

As shown in FIG. 6A, the hole injection transporting layer 106 is then layered to cover the anode 105 and the portions of the planarization layer 104 exposed during patterning. The hole injection transporting layer 106 is formed along the concavity 105f and the like in the anode 105. The upper surface portion 106a of the portion formed on the upper surface portion 105a of the anode 105 differs in height in the direction of the Z-axis from the upper surface portions 106b and 106c of the portions formed on the upper surface portions 105b and 105c of the anode 105. Specifically, the upper surface portions 106b and 106c of the hole injection transporting layer 106 are located higher in the direction of the Z-axis than the upper surface portion 106a.

Figure 6B:
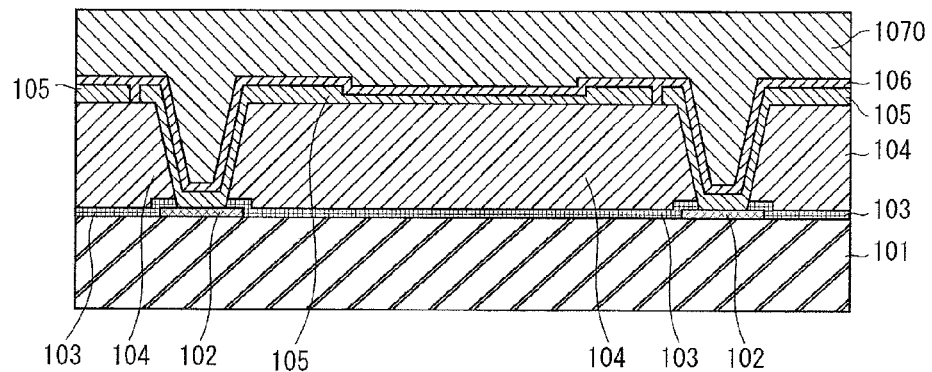

Next, as shown in FIG. 6B, a bank material layer 1070 is layered so as to cover the hole injection transporting layer 106. The bank material layer 1070 is formed by layering photoresist material (such as acrylic resin, polyimide resin, novolac-type phenolic resin, or the like) using spin coating, for example.

Figure 6C:
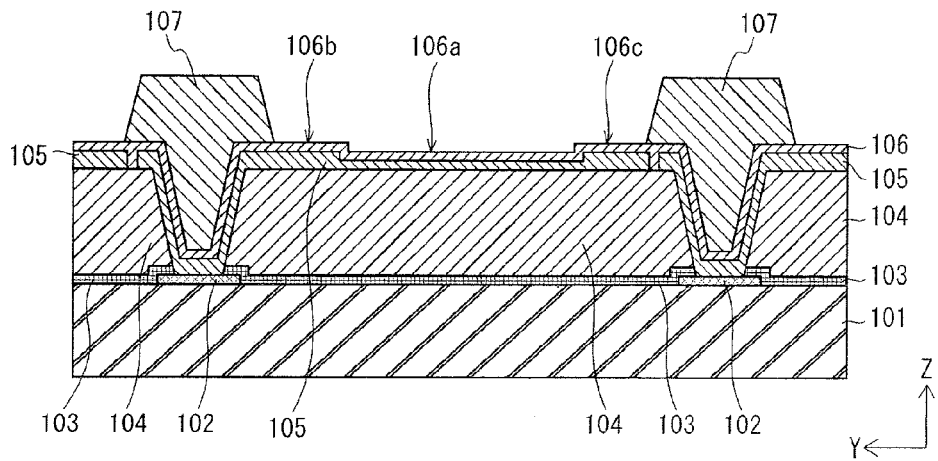

As shown in FIG. 6C, the bank material layer 1070 is exposed after disposing a mask (omitted from the figures) thereon. The bank material layer 1070 is then developed and baked to form the bank 107. After formation of the bank 107, the upper surface (including the upper surface portions 106a, 106b, and 106c) of the hole injection transporting layer 106 is exposed through an opening defined near the bank 107.

Next, as shown in FIG. 7A, ink 1080, which includes light-emitting organic material, is dripped or applied by the inkjet method or the like into the region defined near the bank 107. By drying the ink 1080, the organic light-emitting layer 108 forms, as shown in FIG. 7B.

Since the organic light-emitting layer 108 is formed along the upper surface (including the upper surface portions 106a, 106b, and 106c) of the hole injection transporting layer 106, the upper surface portions 108b and 108c at the edge regions near the bank 107 are located higher in the direction of the Z-axis than the upper surface portion 108a at the central region that is removed from the edge regions near the bank 107 towards the center. Overall, the upper surface of the organic light-emitting layer 108 is therefore concave upwards along the Z-axis.

The lower surface of the organic light-emitting layer 108 is in contact with the upper surface (including the upper surface portions 106a, 106b, and 106c) of the hole injection transporting layer 106. Overall, the lower surface of the organic light-emitting layer 108 is therefore convex in the downward direction of the Z-axis.

Next, as shown in FIG. 7C, the cathode 109 and the sealing layer 110 are layered in this order on the upper surface (including the upper surface portions 108a, 108b, and 108c) of the organic light-emitting layer 108 and the surface of the bank 107.

As described above, an electron transport layer, an electron injection layer, and the like may be inserted between the organic light-emitting layer 108 and the cathode 109.

This completes manufacturing of the main portions of the display panel 10.

Embodiment 2

The structure of the display panel 12 according to Embodiment 2 is described with reference to FIG. 8. FIG. 8 corresponds to FIG. 4 used in Embodiment 1 and focuses on the main portions of one subpixel.

As shown in FIG. 8, in the display panel 12 according to the present embodiment, a planarization layer 124 is the same as in Embodiment 1 in that an upper surface 124a thereof is planarized in a light-emitting region between bank 127.

In the present embodiment, an anode 125 has upper surface portions 125b and 125c in regions corresponding to the edge regions near the bank 127 (regions $E_1$ and $E_2$) and an upper surface portion 125a at a central region that is removed from the edge regions near the bank 127 towards the center. Additionally, the anode 125 has upper surface portions 125g and 125h between the central region and the edge regions. In other words, in the display panel 12 according to the present embodiment, the anode 125 has an upper surface portion 125a at the central region, upper surface portions 125g and 125h located higher in the direction of the Z-axis, and upper surface portions 125b and 125c located even higher in the direction of the Z-axis.

A hole injection transporting layer 126 is formed along the upper surface portion (including the upper surface portions 125a, 125b, 125c, 125g, and 125h) of the anode 125 and has an upper surface portion 126a at the central region, upper surface portions 126g and 126h located higher in the direction of the Z-axis, and upper surface portions 126b and 126c located even higher in the direction of the Z-axis.

Like the organic light-emitting layer 108 in the display panel 10 according to Embodiment 1, in an organic light-emitting layer 128, upper surface portions 128b and 128c at the edge regions near the bank 127 are located higher in the direction of the Z-axis than an upper surface portion 128a at the central region that is removed from the bank 127. Moreover, in the present embodiment, the lower surface portion of the organic light-emitting layer 128 is formed along the upper surface portions 126a, 126b, 126c, 126g, and 126h of the hole injection transporting layer 126, thus further promoting uniformity of the thickness of the organic light-emitting layer 128 in the direction of the Y-axis at each location.

Accordingly, the display panel 12 according to the present embodiment has even luminance and high optical characteristics to a greater extent than the display panel 10 according to Embodiment 1.

Note the structure of the display panel 12 other than the portions shown in FIG. 8 is similar to Embodiment 1.

Embodiment 3

Figure 9:
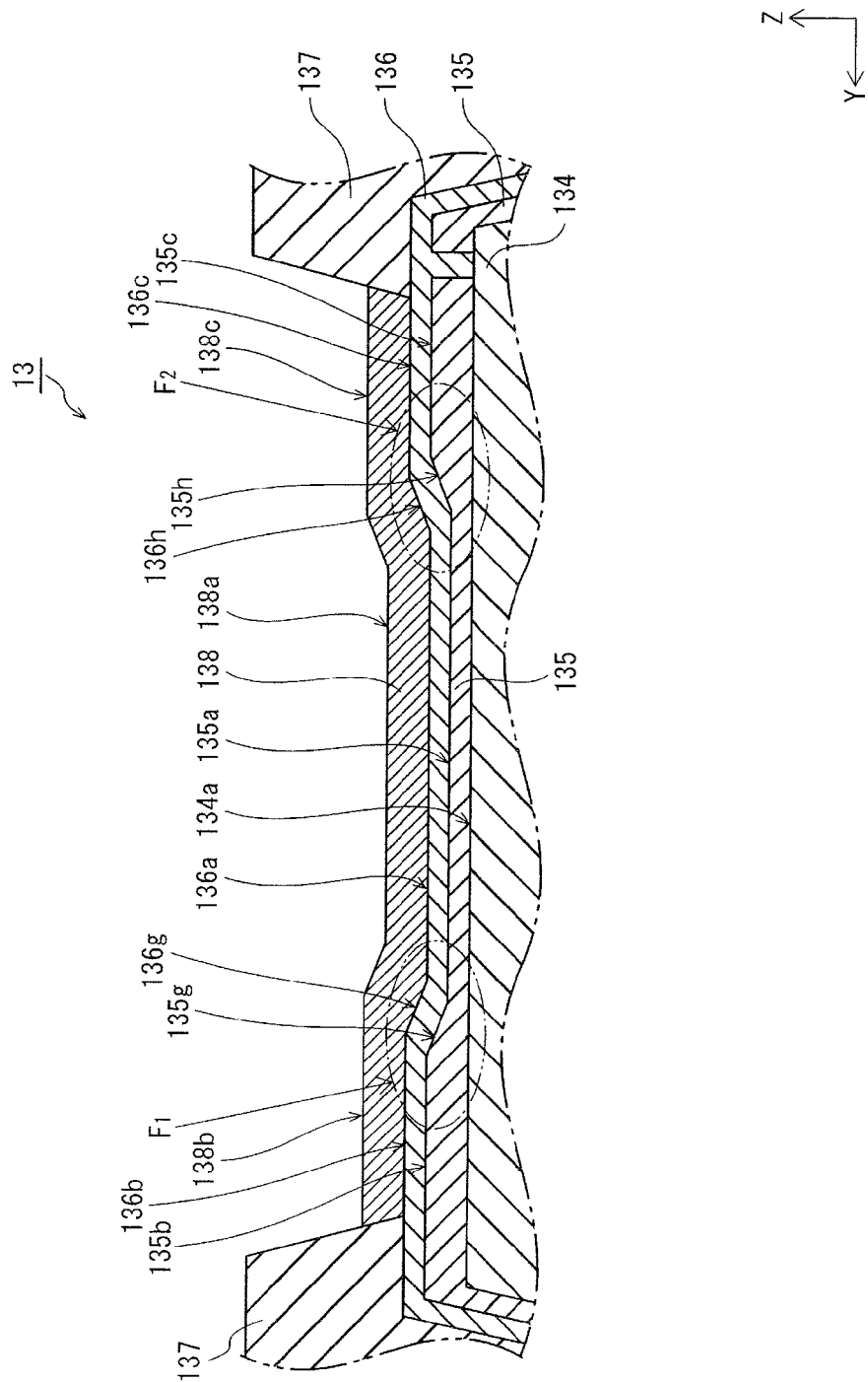
FIG. 9 is a schematic cross-section diagram showing a subpixel in an organic display panel 13 of an organic display device according to Embodiment 3.

The structure of a display panel 13 according to Embodiment 3 is described with reference to FIG. 9. FIG. 9 corresponds to FIG. 4 used in Embodiment 1 and focuses on the main portions of one subpixel.

As shown in FIG. 9, in the display panel 13 according to the present embodiment, an upper surface 134a of a planarization layer 134 is planarized as in Embodiments 1 and 2. Furthermore, an anode 135 is the same as the anode 105 of Embodiment 1 in that the anode 135 has an upper surface portion 135a at a central region that is removed from the bank 137 and upper surface portions 135b and 135c at edge regions (regions $F_1$ and $F_2$) near the bank 137, and in that the upper surface portions 135b and 135c are located higher in the direction of the Z-axis than the upper surface portion 135a.

The anode 135 of the display panel 13 according to the present embodiment differs from the anode 105 of the display panel 10 according to Embodiment 1 in that instead of a wall rising straight up in the direction of the Z-axis, inclined surface portions 135g and 135h are formed between the upper surface portion 135a and the upper surface portions 135b and 135c.

The hole injection transporting layer 136 is formed along the upper surface portion (including the upper surface portions 135a, 135b, and 135c and the inclined surface portions 135g and 135h) of the anode 135 and has an upper surface portion 136a at the central region, upper surface portions 136b and 136c located higher in the direction of the Z-axis, and inclined surface portions 136g and 136h located between the upper surface portion 136a and the upper surface portions 136b and 136c.

Like the organic light-emitting layer 108 of the display panel 10 according to Embodiment 1, in an organic light-emitting layer 138, upper surface portions 138b and 138c at the edge regions near the bank 137 are located higher in the direction of the Z-axis than an upper surface portion 138a at the central region removed from the edge regions near the bank 137 towards the center. In this embodiment as well, the lower surface of the organic light-emitting layer 138 is formed along the upper surface portions 136a, 136b, and 136c as well as the inclined surface portions 136g and 136h of the hole injection transporting layer 136. As a result, the display device 13 according to the present embodiment further promotes uniformity of the thickness of the organic light-emitting layer 138 in the direction of the Y-axis at each location.

Accordingly, the display panel 13 according to the present embodiment has even luminance and high optical characteristics to a greater extent than the display panel 10 according to Embodiment 1.

Note the structure of the display panel 13 other than the portions shown in FIG. 9 is similar to Embodiment 1.

Embodiment 4

Figure 10:
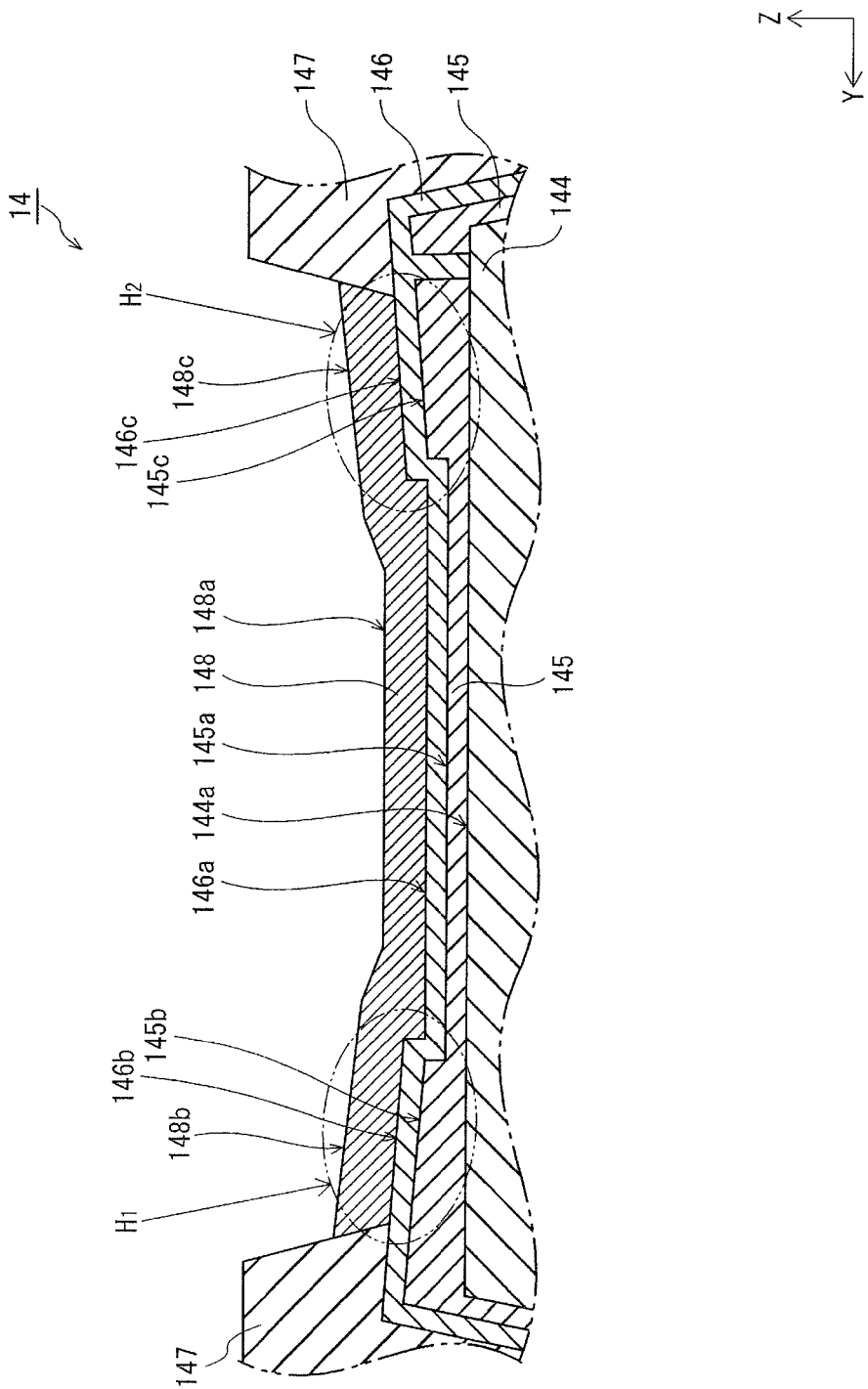
FIG. 10 is a schematic cross-section diagram showing a subpixel in an organic display panel 14 of an organic display device according to Embodiment 4.

The structure of a display panel 14 according to Embodiment 4 is described with reference to FIG. 10. FIG. 10 corresponds to FIG. 4 used in Embodiment 1 and focuses on the main portions of one subpixel.

As shown in FIG. 10, the display panel 14 according to the present embodiment is similar to Embodiment 1 in the following respects: an upper surface 144a of a planarization layer 144 is planarized; an anode 145 has an upper surface portion 145a at a central region that is removed from the bank 147 and upper surface portions 145b and 145c at edge regions (regions $H_1$ and $H_2$) near the bank 147; and the upper surface portions 145b and 145c are located higher in the direction of the Z-axis than the upper surface portion 145a.

In the anode 145 of the display panel 14 according to the present embodiment, upper surface portions 145b and 145c at the edge regions (regions $H_1$ and $H_2$) near the bank 147 differ from the display panel 10 according to Embodiment 1 in that the upper surface portions 145b and 145c are not horizontal surfaces perpendicular to the Z-axis, but rather are inclined.

A hole injection transporting layer 146 is formed along the upper surface (including the upper surface portions 145a, 145b, and 145c) of the anode 145 and has an upper surface portion 146a at the central region and upper surface portions 146b and 146c located higher in the direction of the Z-axis.

Like the organic light-emitting layer 108 of the display panel 10 according to Embodiment 1, in an organic light-emitting layer 148, upper surface portions 148b and 148c at the edge regions near the bank 147 are located higher in the direction of the Z-axis than an upper surface portion 148a at the central region removed from the edge regions near the bank 147 towards the center. In this embodiment as well, the lower surface of the organic light-emitting layer 148 is formed along the upper surface portions 146a, 146b, and 146c of the hole injection transporting layer 146. As a result, the display device 14 according to the present embodiment further promotes uniformity of the thickness of the organic light-emitting layer 148 in the direction of the Y-axis at each location.

Accordingly, the display panel 14 according to the present embodiment has even luminance and high optical characteristics to a greater extent than the display panel 10 according to Embodiment 1.

Note the structure of the display panel 14 other than the portions shown in FIG. 10 is similar to Embodiment 1.

Furthermore, the surface profile of the organic light-emitting layer 148 in the display panel 14 according to the present embodiment differs from the surface profile of the organic light-emitting layers 108, 128, and 138 in Embodiments 1, 2, and 3 respectively, but the surface profile does not change due to a level difference in the underlayer. In other words, when the surface profile of the organic light-emitting layer 148 is as shown in FIG. 10, the present embodiment may be adopted.

[Other Considerations]

In Embodiment 1, the hole injection transporting layer 106, which is lower in the direction of the Z-axis than the organic light-emitting layer 108, is formed along the upper surface of the anode 105, so that the upper surface portions 106b and 106c at the edge regions near the bank 107 are located higher in the direction of the Z-axis than the upper surface portion 106a at the central region removed from the edge regions near the bank 107 towards the center. Furthermore, in Embodiment 2, the upper surface portion 126a, the upper surface portions 126g and 126h, and the upper surface portions 126b and 126c form steps.

By forming the lower surface of the organic light-emitting layers 108, 128, 138, and 148 along the profile of the upper surface portions insofar as possible, it has been described that the difference between the thickness at the edge regions near the bank 107, 127, 137, and 147 and the thickness at the central regions removed from the edge regions near the bank 107, 127, 137, and 147 towards the center can be reduced. From the perspective of accuracy during manufacturing and of manufacturing costs, it is preferable for the upper surface profile of the functional layer, such as the hole injection transporting layer provided directly below the organic light-emitting layer, to be approximated as closely as possible to the upper surface profile of the organic light-emitting layer. For example, the number of steps in the upper surface profile of the functional layer can be set to three or greater, and inclined surfaces may be provided between steps.

Note that the structures in Embodiments 1, 2, 3, and 4 may be combined while taking into consideration the upper surface profile of the organic light-emitting layers 108, 128, 138, and 148.

Furthermore, in Embodiments 1, 2, 3, and 4, the respective hole injection transporting layer 106, 126, 136, and 146 is inserted between the respective anode 105, 125, 135, and 145 and the respective organic light-emitting layer 108, 128, 138, and 148. The present invention is not, however, limited in this way. For example, the functional layer may alternatively be composed of only the hole-injection layer.

In Embodiments 1, 2, 3, and 4, an example of a structure is described in which the respective anode 105, 125, 135, and 145 is provided below the respective organic light-emitting layer 108, 128, 138, and 148 in the direction of the Z-axis, and the cathode 109 is provided thereabove in the direction of the Z-axis. Conversely, the cathode may be provided lower in the direction of the Z-axis, with the anode being provided higher in the direction of the Z-axis.

In Embodiments 1, 2, 3, and 4, it is assumed that light emitted by the organic light-emitting layers 108, 128, 138, and 148 traverses the cathode 109 and is emitted upwards in the direction of the Z-axis (top-emission type). Conversely, the present invention may be adopted in a structure in which light traverses the substrate 101 and is emitted downwards in the direction of the Z-axis (bottom-emission type).

Figure 11:
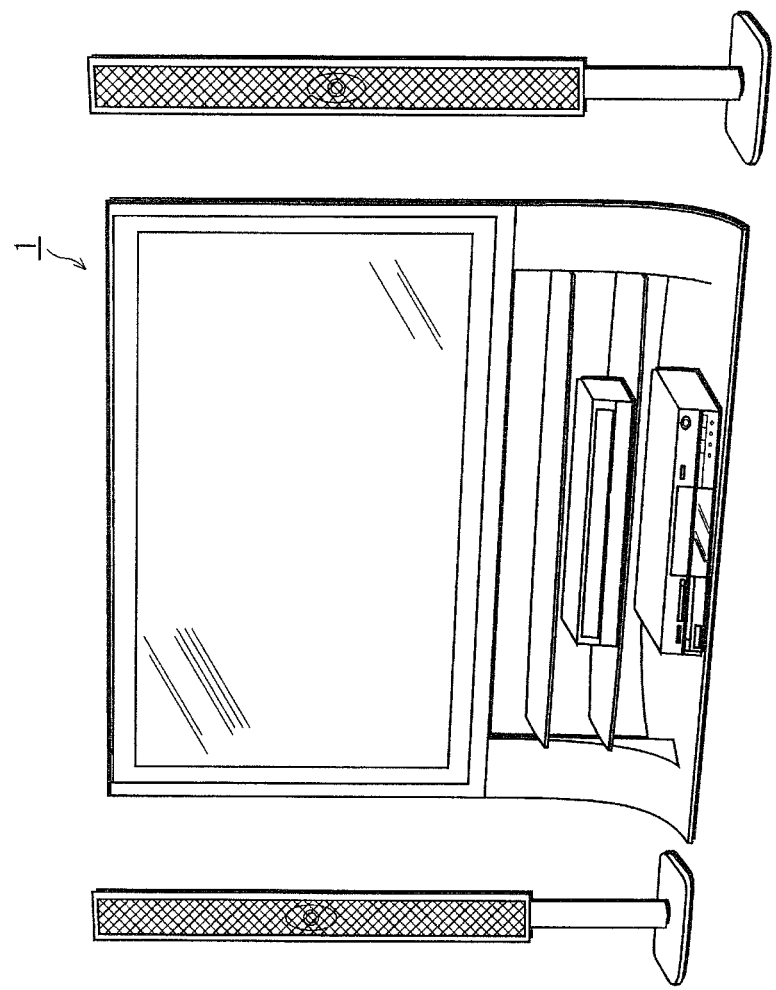
FIG. 11 is an external perspective view showing an example of the appearance of a set that includes the organic display device 1.

In Embodiments 1, 2, 3, and 4, a specific example of the appearance of the organic display device 1 is not shown. The organic display device 1 may be part or all of a system as shown, for example, in FIG. 11.

INDUSTRIAL APPLICABILITY

The present invention is useful for achieving an organic light-emitting element, organic display panel, and organic display device with even luminance and high optical characteristics.

The invention claimed is:

1. An organic light-emitting element comprising:
an underlayer including a substrate, a drive circuit formed on the substrate, and a planarization layer formed on the drive circuit, an upper surface of the underlayer being planarized;
a first electrode above the planarized upper surface of the underlayer;
a functional layer above the first electrode;
a bank above the first electrode defining an aperture and partitioning adjacent light-emitting cells;
a light-emitting layer, formed from ink including organic light-emitting material, above the functional layer at a location corresponding to the aperture defined near the bank; and
a second electrode, having opposite polarity from the first electrode, above the light-emitting layer, wherein
the first electrode includes a first upper surface portion and a second upper surface portion, the first upper surface portion corresponding to an edge region of the light-emitting layer near the bank, and the second upper surface portion corresponding to another region removed from the edge region towards a center of the light-emitting layer,
the first upper surface portion of the first electrode is located above the second upper surface portion of the first electrode, the second upper surface portion of the first electrode is planarized, and the first upper surface portion of the first electrode has a level difference or is formed as a step with respect to the second upper surface portion of the first electrode, the functional layer is formed along the first upper surface portion and the second upper surface portion of the first electrode and includes a first upper portion and a second upper portion, the first upper surface portion corresponding to the edge region of the light-emitting layer near the bank, and the second upper surface portion corresponding to the other region removed from the edge region towards the center of the light-emitting layer, the first upper surface portion of the functional layer is located above the second upper surface portion of the functional layer, the light-emitting layer is formed along the first upper surface portion and the second upper surface portion of the functional layer and includes a first lower surface portion, a second lower surface portion, a first upper surface portion, and a second upper surface portion, the first lower surface portion touching the functional layer and corresponding to the edge region near the bank, the second lower surface portion touching the functional layer and corresponding to the other region removed from the edge region towards the center, the first upper surface portion located opposite the functional layer and corresponding to the edge region near the bank, and the second upper surface portion located opposite the functional layer and corresponding to the other region removed from the edge region towards the center, the first lower surface portion of the light-emitting layer is located above the second lower surface portion of the light-emitting layer, the first upper surface portion of the light-emitting layer is located above the second upper surface portion of the light-emitting layer, and a thickness of the light-emitting layer between the first lower surface portion and the first upper surface portion is equivalent to a thickness of the light-emitting layer between the second lower surface portion and the second upper surface portion.

2. The organic light-emitting element of claim 1, wherein an upper surface of the light-emitting layer, including the first upper surface portion and the second upper surface portion, is concave upwards due to the first upper surface portion of the light-emitting layer being located above the second upper surface portion of the light-emitting layer, and a lower surface of the light-emitting layer, including the first lower surface portion and the second lower surface portion, is convex downwards due to the first lower surface portion of the light-emitting layer being located above the second lower surface portion of the light-emitting layer.

3. The organic light-emitting element of claim 1, wherein the first upper surface portion of the functional layer is located above the second upper surface portion of the functional layer by a distance in a range between 100 nm and 200 nm.

4. The organic light-emitting element of claim 1, wherein when viewing a cross-section of the light-emitting layer between portions of the bank, a length of the first upper surface portion of the light-emitting layer is at least 50 µm, a length of the second upper surface portion of the light-emitting layer is at least 50 µm, the length of the first upper surface portion of the light-emitting layer is between $1/5$ and $1/3$ an entire length of each light-emitting cell, and the length of the second upper surface portion of the light-emitting layer is between $1/3$ and $3/5$ the entire length of each light-emitting cell.

5. The organic light-emitting element of claim 1, wherein in the light-emitting layer, the other region removed from the edge region towards the center of the light-emitting layer is centered between adjacent portions of the bank.

6. The organic light-emitting element of claim 1, wherein the light-emitting cells are arrayed in two different directions, the bank is formed in the two different directions so as to partition adjacent light-emitting cells, and the first upper surface portion and the second upper surface portion of the first electrode, the first upper surface portion and the second upper surface portion of the functional layer, and the first upper surface portion, the second upper surface portion, the first lower surface portion, and the second lower surface portion of the light-emitting layer are provided in a direction of length of the light-emitting layer when viewing the light-emitting cell from above.

7. A method of manufacturing an organic light-emitting element comprising:

forming a drive circuit on a substrate and forming a planarization layer on the drive circuit in order to form an underlayer that includes the drive circuit and the planarization layer and that has a planarized upper surface;

forming a first electrode above the planarized underlayer;

forming a functional layer above the first electrode;

forming a bank above the first electrode to define an aperture and partition adjacent light-emitting cells;

forming a light-emitting layer, above the functional layer at a location corresponding to the aperture defined near the bank, by applying ink that includes organic light-emitting material; and forming a second electrode, having opposite polarity from the first electrode, above the light-emitting layer, wherein in the forming of the first electrode, the first electrode is formed so that the first electrode includes a first upper surface portion and a second upper surface portion, the first upper surface portion corresponding to an edge region of the light-emitting layer near the bank, and the second upper surface portion corresponding to another region removed from the edge region towards a center of the light-emitting layer, the first upper surface portion of the first electrode is located above the second upper surface portion of the first electrode, and the second upper surface portion of the first electrode is planarized, and the first upper surface portion of the first electrode has a level difference or is formed as a step with respect to the second upper surface portion of the first electrode, in the forming of the functional layer, the functional layer is formed along the first upper surface portion and the second upper surface portion of the first electrode, is formed to include a first upper portion and a second upper portion, the first upper surface portion corresponding to the edge region of the light-emitting layer near the bank, and the second upper surface portion corresponding to the other region removed from the edge region towards the center of the light-emitting layer, and is formed so that the first upper surface portion of the functional layer is located above the second upper surface portion of the functional layer, and in the forming of the light-emitting layer, the light-emitting layer is formed along the first upper surface portion and the second upper surface portion of the functional layer, and is formed to include a first lower surface portion, a second lower surface portion, a first upper surface portion, and a second upper surface portion, the first lower surface portion touching the functional layer and corresponding to the edge region near the bank, the second lower surface portion touching the functional layer and corresponding to the other region removed from the edge region towards the center, the first upper surface portion located opposite the functional layer and corresponding to the edge region near the bank, and the second upper surface portion located opposite the functional layer and corresponding to the other region removed from the edge region towards the center, the first lower surface portion of the light-emitting layer is formed to be located above the second lower surface portion of the light-emitting layer, the first upper surface portion of the light-emitting layer is formed to be located above the second upper surface portion of the light-emitting layer, and a thickness of the light-emitting layer between the first lower surface portion and the first upper surface portion is formed to be equivalent to a thickness of the light-emitting layer between the second lower surface portion and the second upper surface portion.

8. An organic display panel using organic light-emitting elements manufactured by the method of manufacturing an organic light-emitting element of claim 7.

9. An organic display device using organic light-emitting elements manufactured by the method of manufacturing an organic light-emitting element of claim 7.

* * * * *